United States Patent
Tashiro et al.

(10) Patent No.: US 7,748,824 B2
(45) Date of Patent: Jul. 6, 2010

(54) EJECTING APPARATUS, APPLYING METHOD, MANUFACTURING METHOD OF COLOR FILTER SUBSTRATE, MANUFACTURING METHOD OF ELECTROLUMINESCENCE DISPLAY APPARATUS, MANUFACTURING METHOD OF PLASMA DISPLAY APPARATUS, AND MANUFACTURING METHOD OF WIRE

(75) Inventors: Masasyuki Tashiro, Chino (JP); Mitsuru Kuribayashi, Chino (JP)

(73) Assignee: Seiko Epson Corporation (JP)

( * ) Notice: Subject to any disclaimer, the term of this patent is extended or adjusted under 35 U.S.C. 154(b) by 1152 days.

(21) Appl. No.: 10/965,005

(22) Filed: Oct. 14, 2004

(65) Prior Publication Data

US 2006/0051496 A1 Mar. 9, 2006

(30) Foreign Application Priority Data

Oct. 15, 2003 (JP) ............................. 2003-355257

(51) Int. Cl.
*B41J 2/15* (2006.01)

(52) U.S. Cl. ....................................................... 347/40

(58) Field of Classification Search ................ 347/9–11
See application file for complete search history.

(56) References Cited

U.S. PATENT DOCUMENTS

| 6,145,981 | A | * | 11/2000 | Akahira et al. | ............... 347/107 |
| 6,533,379 | B1 | | 3/2003 | Kubota | |
| 2003/0137555 | A1 | * | 7/2003 | Vanhooydonck et al. | ...... 347/41 |
| 2005/0237350 | A1 | * | 10/2005 | Aoki | ............................ 347/9 |

FOREIGN PATENT DOCUMENTS

| JP | 09-011455 | 1/1997 |
| JP | 10-286966 | 10/1998 |
| JP | 11-240158 | 9/1999 |
| JP | 2001-026101 | 1/2001 |
| JP | 2003-127343 | 5/2003 |

* cited by examiner

*Primary Examiner*—Matthew Luu
*Assistant Examiner*—Justin Seo
(74) *Attorney, Agent, or Firm*—Harness, Dickey & Pierce, P.L.C.

(57) ABSTRACT

An ejecting apparatus is provided for readily controlling ejection even when the number of nozzles is increased. In each of N heads in an ejecting apparatus, DA equals a distance between a first nozzle array and a second nozzle array, and a distance between the second nozzle array in one arbitrary head of the N heads and the first nozzle array in another head adjacent to this arbitrary head in the Y-axis direction is substantially equal to an integer multiple of DA.

5 Claims, 24 Drawing Sheets

F I G. 1
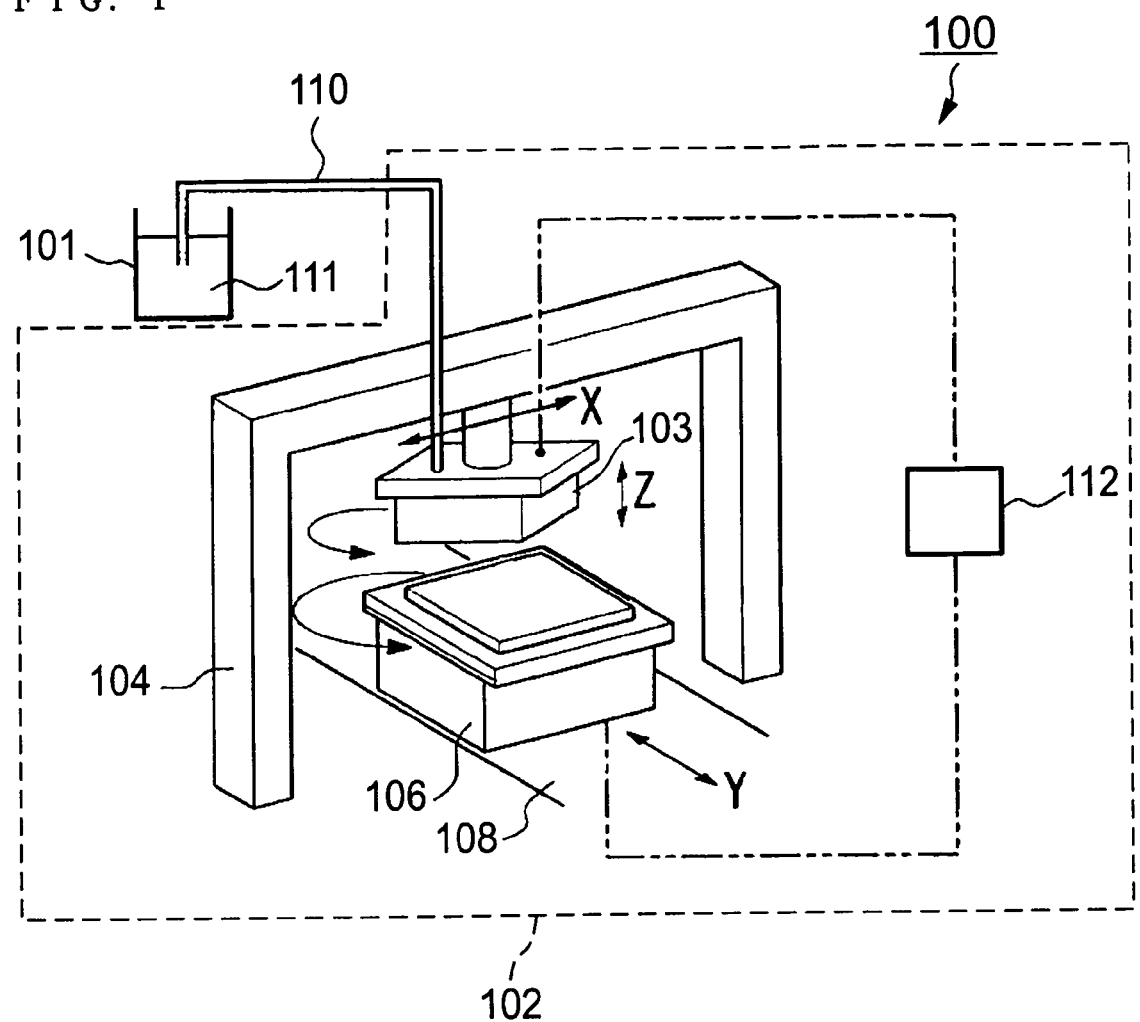

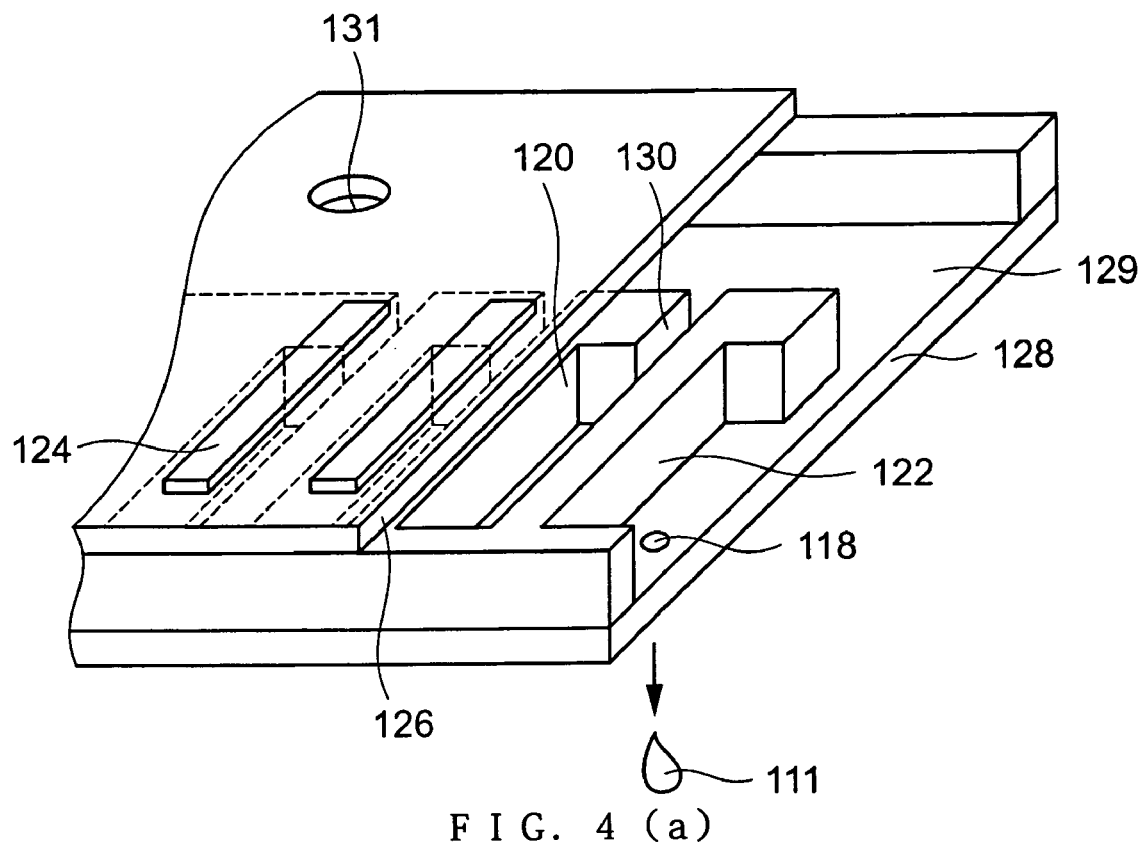
F I G. 4 (a)
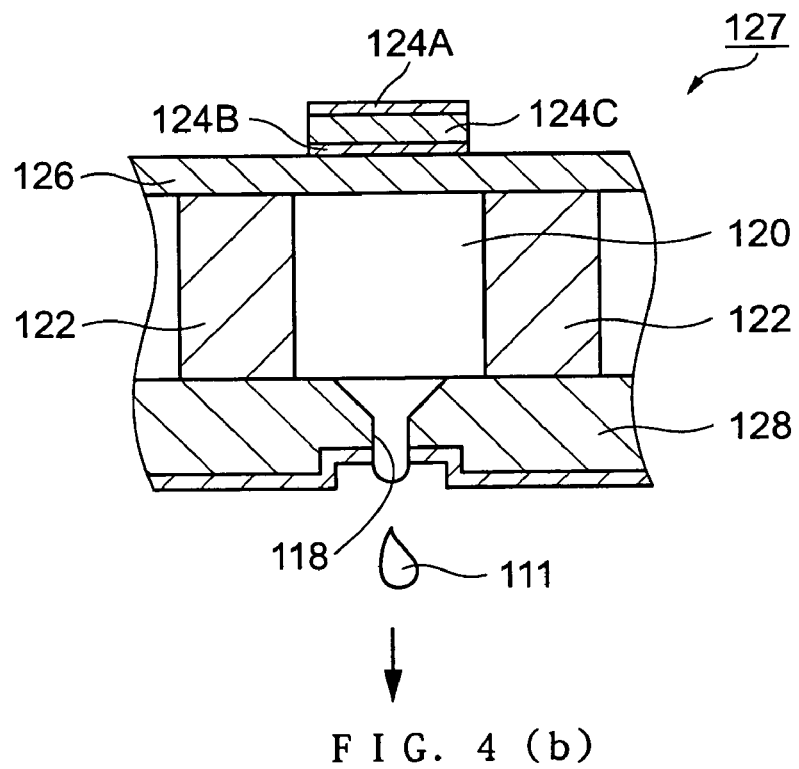
F I G. 4 (b)

FIG. 7 (a)
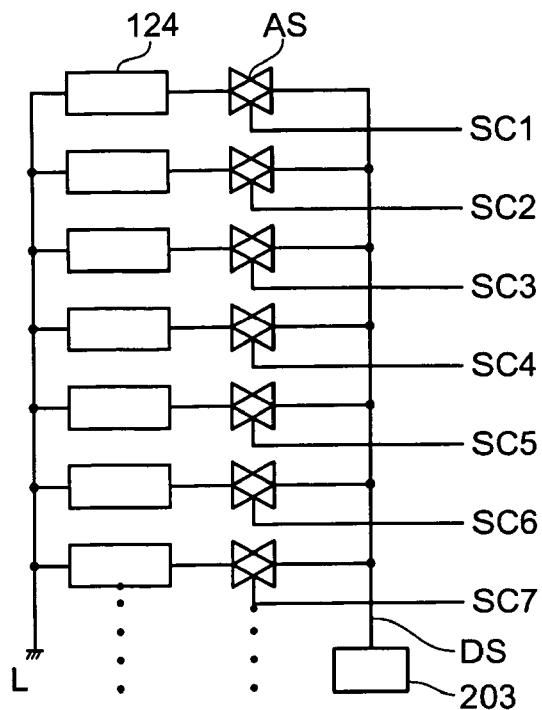
FIG. 7 (b)
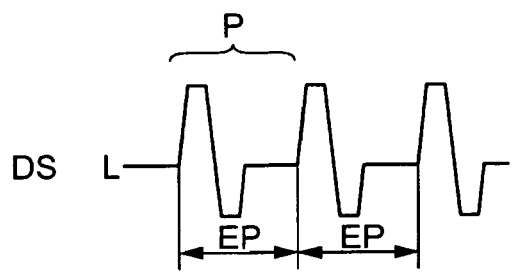
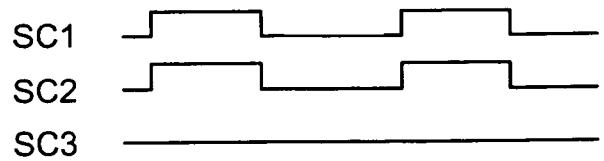
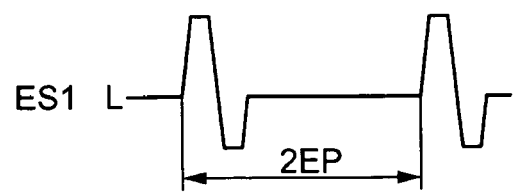
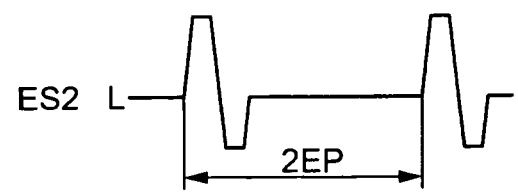

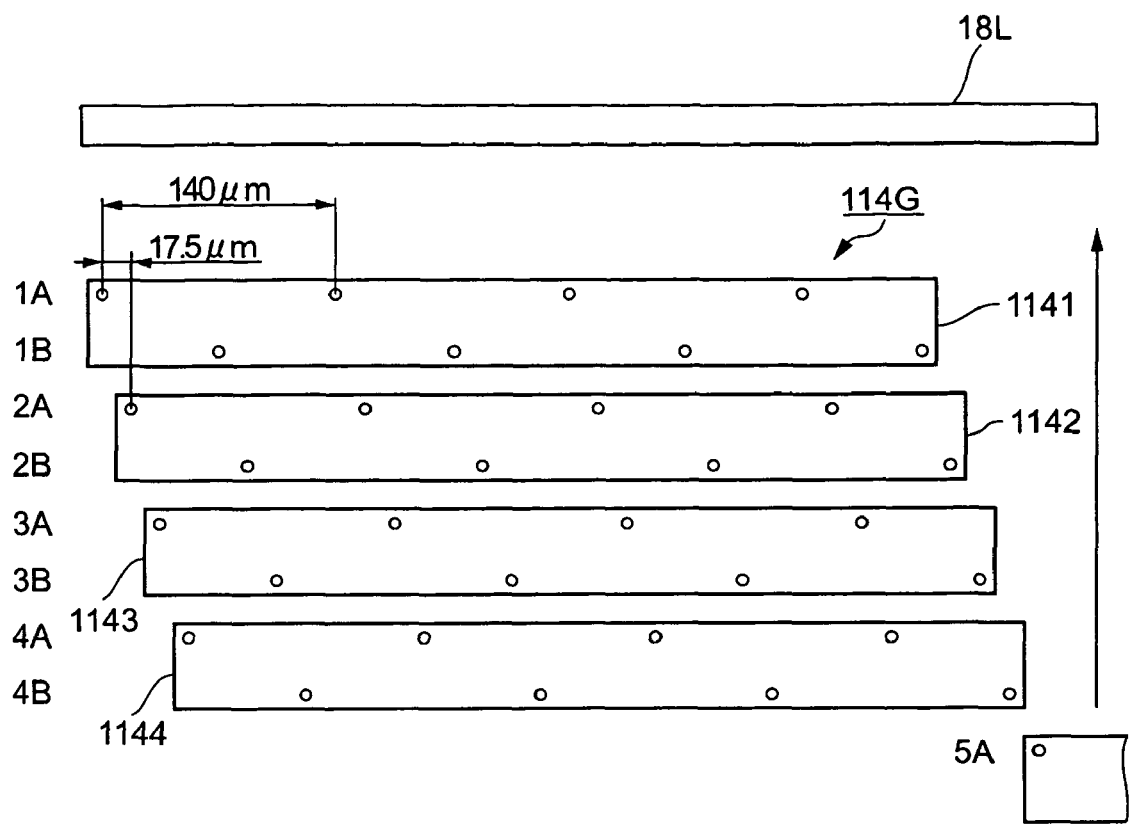
FIG. 8 (a)
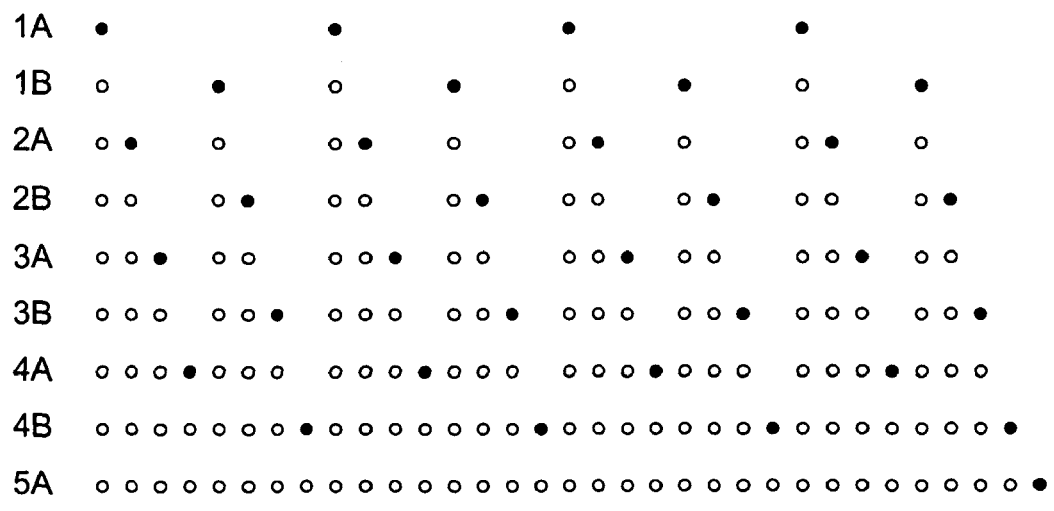
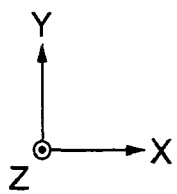
FIG. 8 (b)

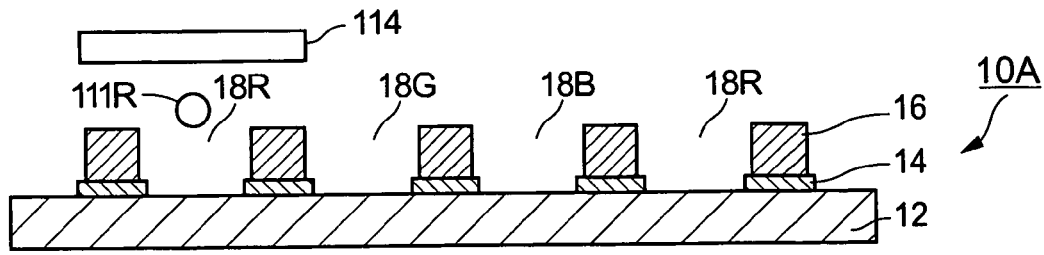
F I G. 1 4 (a)
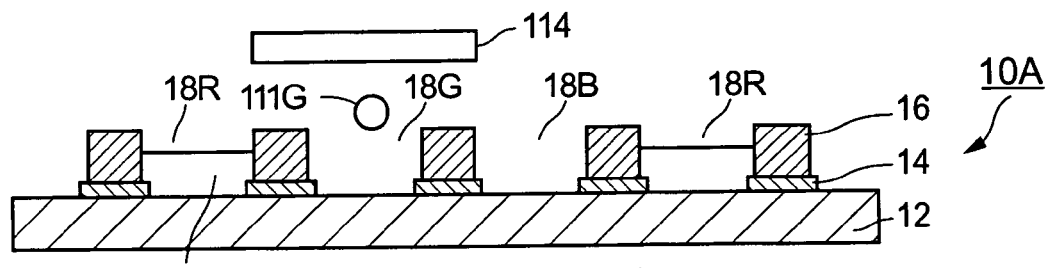
F I G. 1 4 (b)
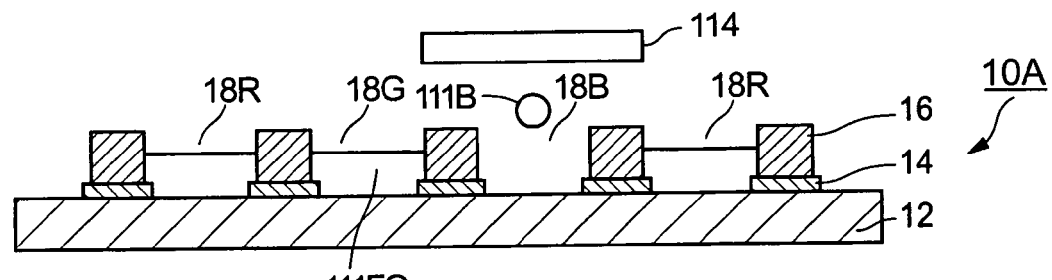
F I G. 1 4 (c)
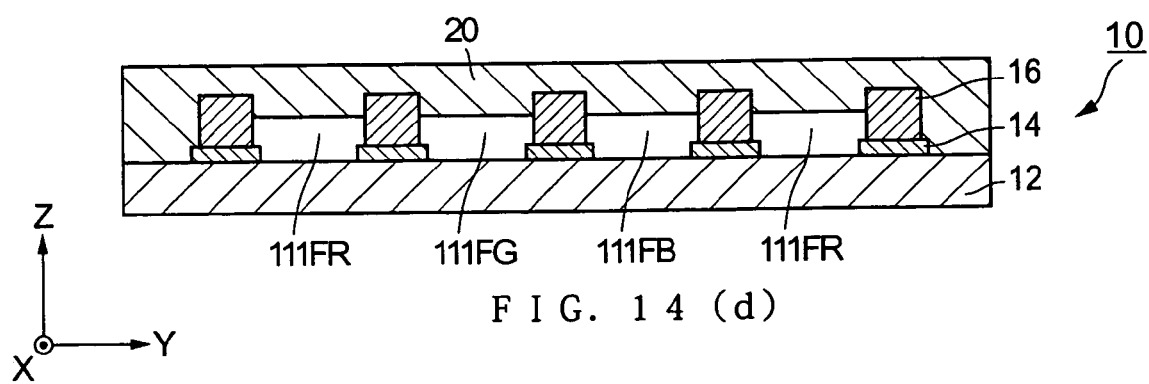
F I G. 1 4 (d)

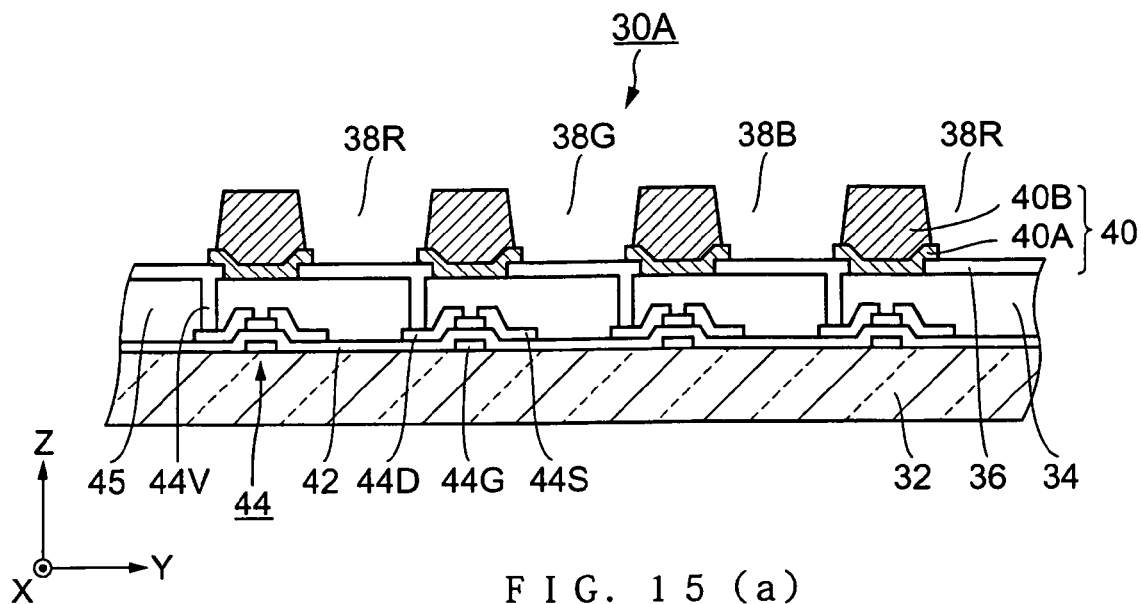
F I G. 1 5 (a)
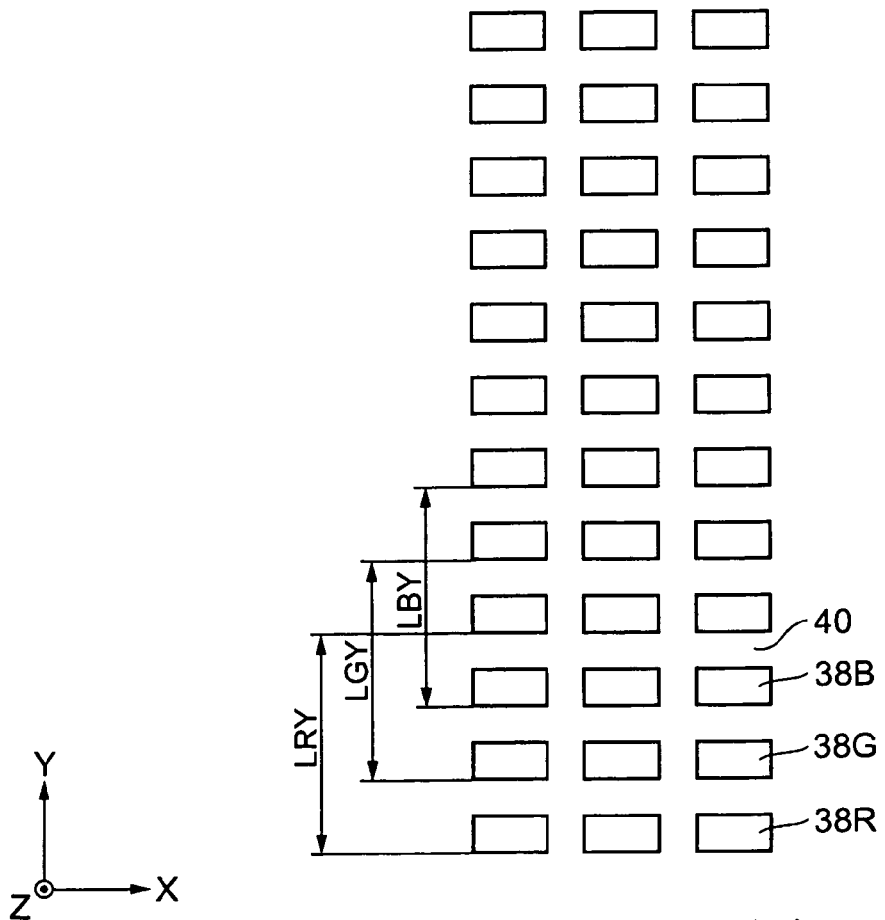
F I G. 1 5 (b)

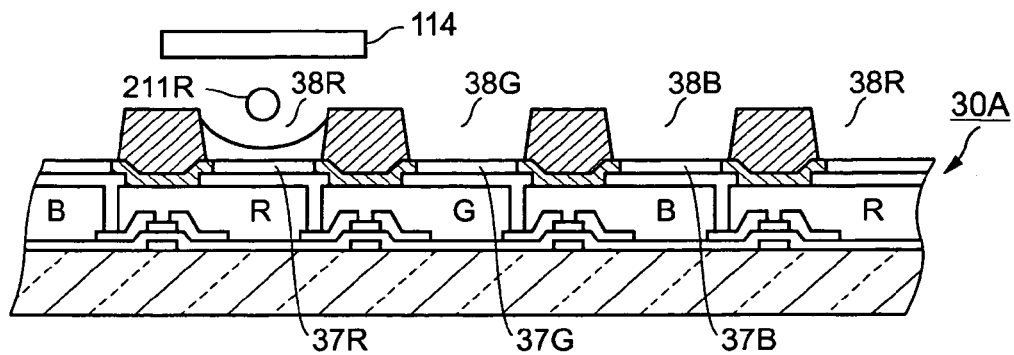
F I G. 1 8 (a)
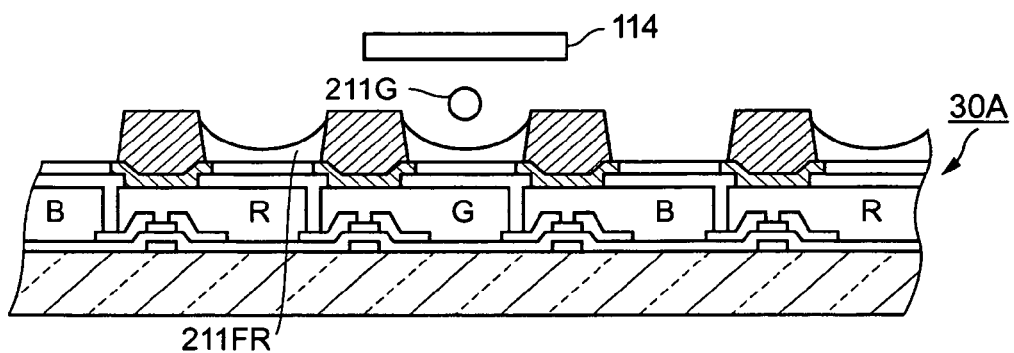
F I G. 1 8 (b)
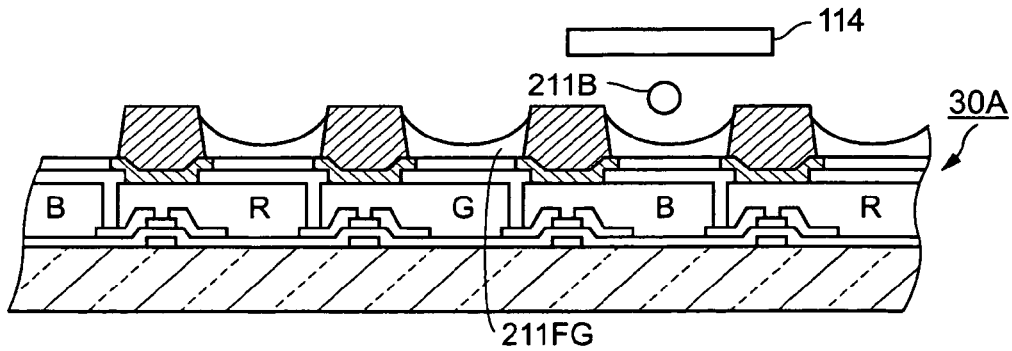
F I G. 1 8 (c)
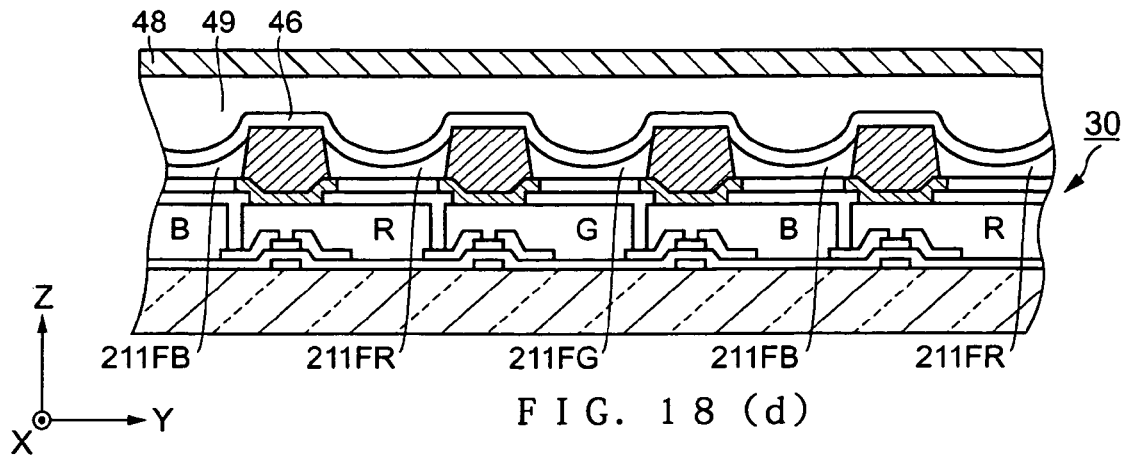
F I G. 1 8 (d)

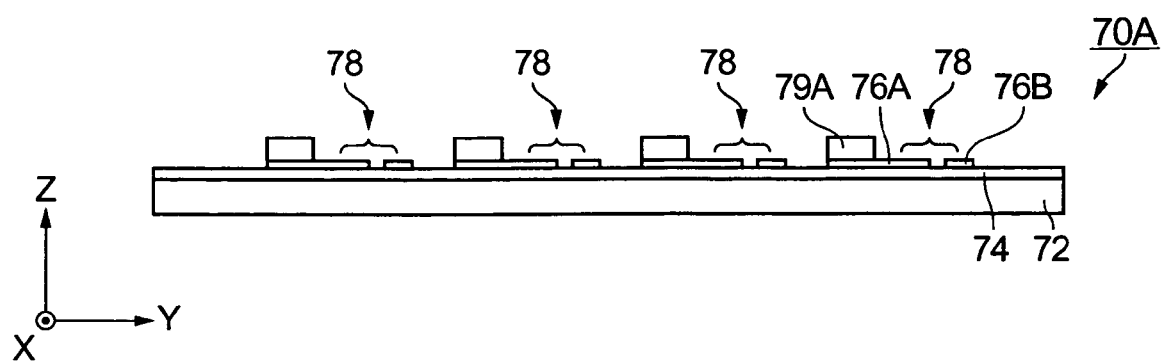
F I G. 2 4 (a)
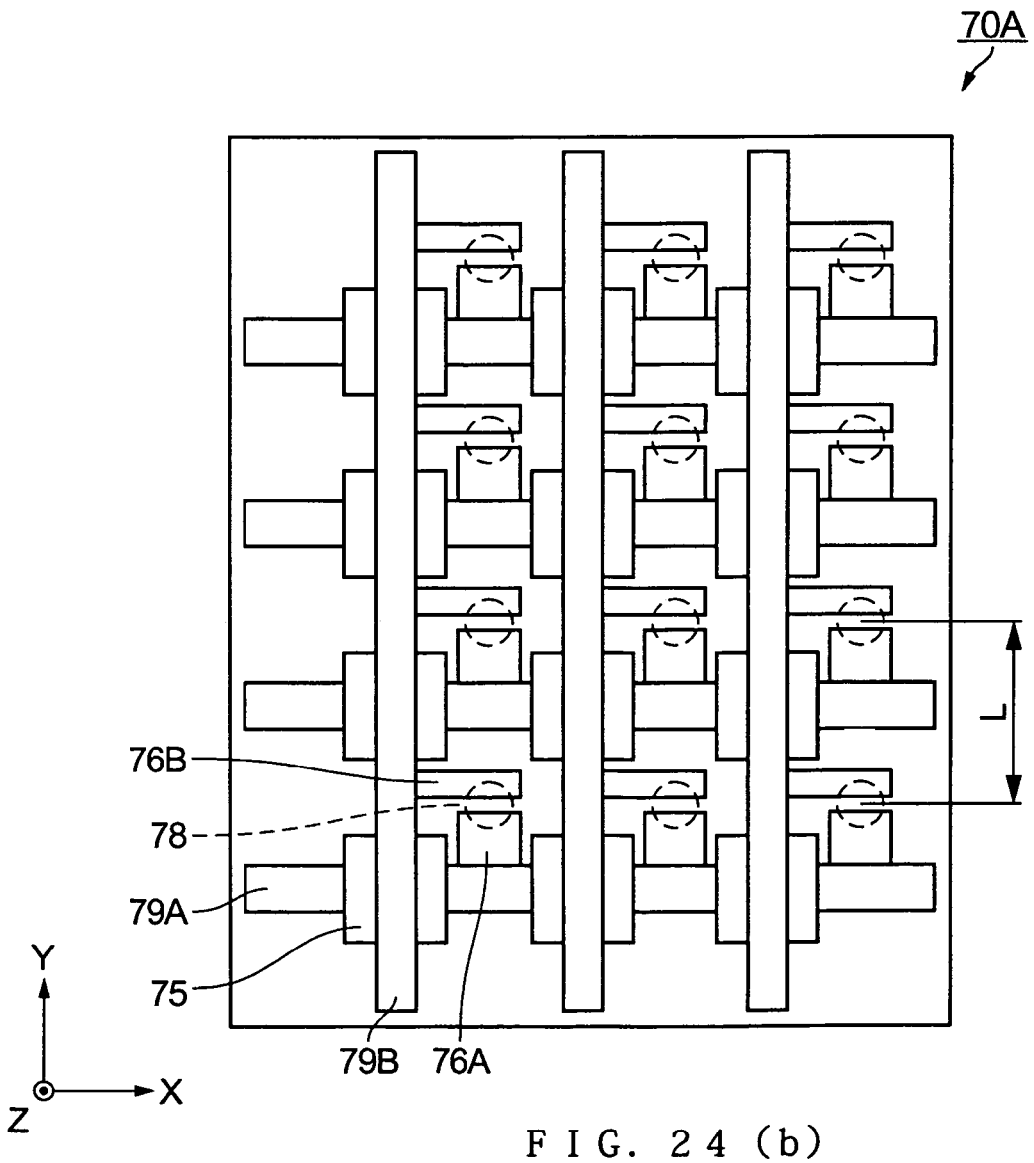
F I G. 2 4 (b)

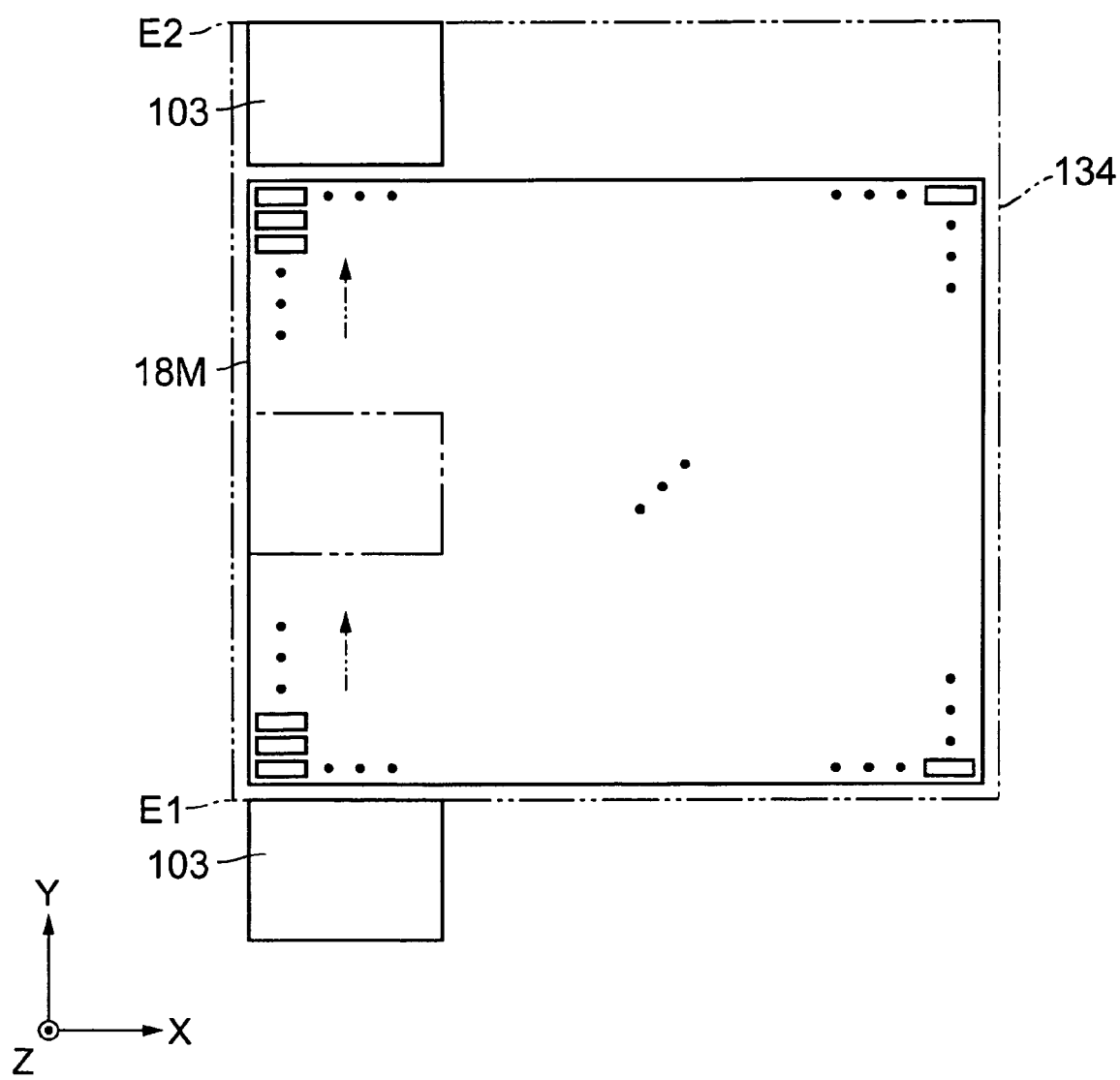

EJECTING APPARATUS, APPLYING METHOD, MANUFACTURING METHOD OF COLOR FILTER SUBSTRATE, MANUFACTURING METHOD OF ELECTROLUMINESCENCE DISPLAY APPARATUS, MANUFACTURING METHOD OF PLASMA DISPLAY APPARATUS, AND MANUFACTURING METHOD OF WIRE

RELATED APPLICATIONS

This application claims priority to Japanese Patent Application No. 2003-355257 filed Oct. 15, 2003 which is hereby expressly incorporated by reference herein in its entirety.

BACKGROUND

1. Technical Field

The present invention relates to an ejecting apparatus and an ejecting method for ejecting a liquid material, and more particularly to an ejecting apparatus and an ejecting method suitable for applying a liquid material to regions that are periodically placed in a color filter substrate, a matrix display apparatus, and the like.

2. Background Art

It is known to apply a material to regions made into pixels with the use of an ink jet apparatus. For example, it is known to form filter elements on a color filter substrate or luminous portions placed in a matrix fashion in a matrix display apparatus, with the use of an ink jet apparatus (for example, JP-A-2003-127343).

The pitches of a plurality of ejected portions to which a material is to be applied often do not match a nozzle pitch of an ink jet apparatus used in the process. The ejected portions mean, for example, portions where filter elements are to be provided.

For this reason, in a conventional ink jet apparatus, the ink jet head (or a direction in which the ejection nozzles are aligned) is tilted with respect to a direction in which the ejected portions are aligned, so that a distance between two ejected portions and a distance between two ejection nozzles matches. According to this configuration, however, an angle of attachment of the ink jet head needs to be changed for each color filter when a distance between the two ejected portions differs for each color filter. To change an angle of attachment of the head, a new carriage has to be manufactured according to an angle of the head, and further the head has to be re-attached to the new carriage.

In addition, control of ejection becomes more complicated with an increasing number of nozzles.

The invention was devised in view of the problems as described above, and therefore has an object to provide an ejecting apparatus capable of readily controlling ejection even when the number of nozzles is increased.

SUMMARY

An ejecting apparatus of the invention includes a stage and N heads allowed to move in a Y-axis direction relatively with respect to the stage, and the N heads are adjacent to each other in the Y-axis direction. Each of the N heads includes a first nozzle array and a second nozzle array both extending in an X-axis direction, and in each of the N heads, DA equals a distance between the first nozzle array and the second nozzle array, while a distance between the second nozzle array in one arbitrary head of the N heads and the first nozzle array in another head adjacent to the arbitrary head is substantially equal to an integer multiple of DA. Herein, N is an integer equal to or greater than 2, and the X-axis direction and the Y-axis direction intersect each other at a right angle.

According to the above, by moving the N heads in the Y-axis direction relatively with respect to the stage in such a manner that the first nozzle array and the second nozzle array overlap the ejected portion at a time interval equal to an integer multiple of an ejection period, all the nozzle arrays in the N heads overlap a single ejected portion on the stage at time intervals equal to integer multiples of the ejection period in the same phase. This makes it easier to control ejection of a liquid material to a single ejected portion.

It is preferable that the stage holds a base body having an ejected portion, and that the N heads move in the Y-axis direction relatively with respect to the stage in such a manner that the first nozzle array and the second nozzle array in any one of the N heads enter a region corresponding to the ejected portion and eject a liquid material from corresponding nozzles at a time interval substantially equal to an integer multiple of an ejection period.

According to the above, because the N heads move in the Y-axis direction relatively with respect to the stage in such a manner that the first nozzle array and the second nozzle array overlap the ejected portion at a time interval equal to an integer multiple of the ejection period, all the nozzle arrays in the N heads overlap the ejected portion at time intervals equal to integer multiples of the ejection period in the same phase. This makes ejection control easier.

It is preferable that the stage holds a base body having a plurality of ejected portions aligned at predetermined pitches in the Y-axis direction, and that the N heads move in the Y-axis direction relatively with respect to the stage in such a manner that one of the first nozzle array and the second nozzle array in any one of the N heads enters regions respectively corresponding to the plurality of ejected portions and eject a liquid material from corresponding nozzles at time intervals substantially equal to integer multiples of an ejection period.

According to the above, because the N heads move in the Y-axis direction relatively with respect to the stage in such a manner that the first nozzle array in a given head overlaps a plurality of ejected portions at time intervals equal to integer multiples of the ejection period, all the nozzle arrays in the head overlap the ejected portions at time intervals equal to integer multiples of the ejection period in the same phase. This makes ejection control easier.

In one aspect, a plane image of each of the plurality of ejected portions is a rectangular shape determined by long sides and short sides, and the stage holds the base body in such a manner that a direction of the long sides is parallel to the X-axis direction and a direction of the short sides is parallel to the Y-axis direction.

According to the above, more nozzles overlap the ejected portions at a single time. It is thus possible to apply a desired volume of liquid material to the ejected portions even when the N heads move relatively fewer times.

In another aspect, the N heads form a head group, a plurality of nozzles are placed in the first nozzle array and the second nozzle array in such a manner that a nozzle pitch in the X-axis direction of each of the N heads takes a specific value, and the N heads are placed in such a manner that a nozzle pitch in the X-axis direction of the head group is substantially equal to 1/N of the specific value.

According to the above, because the nozzle pitch in the X-axis direction of the head group, that is, the nozzle pitch in the X-axis direction of the ejecting apparatus, is shorter than the nozzle pitch in the X-axis direction of the individual heads, finer intervals can be set among the ON nozzles. Application by scanning is thus enabled for a base body on which a plurality of ejected portions are aligned in the X-axis direction at various pitches, without having to change an angle of attachment of the heads.

In still another aspect, with respect to an X-coordinate of a reference nozzle in one of the N heads, X-coordinates of reference nozzles in other (N−1) heads are shifted, without being overlapped, by a length equal to j/N of the specific value, where j is a natural number from 1 to (N−1).

According to the above, the nozzle pitch in the X-axis direction in the head group can be 1/N of the nozzle pitch in the X-axis direction in the individual heads.

An applying method of the invention for applying a liquid material includes using an ejecting apparatus equipped with N heads, wherein each of the N heads includes a first nozzle array and a second nozzle array both extending in an X-axis direction, and DA equals a distance between the first nozzle array and the second nozzle array in each of the N heads. The applying method includes: a step (A) of placing a base body having an ejected portion on a stage; a step (B) of moving the N heads in a Y-axis direction, which intersects with the X-axis direction at a right angle, relatively with respect to the base body, while maintaining a distance between the second nozzle array in one arbitrary head of the N heads and the first nozzle array in another head adjacent to the arbitrary head to be substantially equal to an integer multiple of DA; and a step (C) of ejecting, when nozzles included in the first or second nozzle array enter a region corresponding to the ejected portion in the step (B), a liquid material to the ejected portion from the nozzles.

According to the above, by moving the N heads in the Y-axis direction relatively with respect to the stage in such a manner that the first nozzle array and the second nozzle array overlap the ejected portion at a time interval equal to an integer multiple of the ejection period, all the nozzle arrays in the N heads overlap the ejected portion at time intervals equal to integer multiples of the ejection period in the same phase. This makes ejection control easier.

It should be appreciated that the invention can be achieved in various modes, and for example, the invention can be achieved as a manufacturing method of a color filter, a manufacturing method of an electroluminescence display apparatus, a manufacturing method of a plasma display apparatus, and the like.

BRIEF DESCRIPTION OF THE DRAWINGS

FIG. 1 is a schematic view showing an ejecting apparatus of a first embodiment.

FIG. 4(a) and FIG. 4(b) are schematic views showing an ejecting portion in the head of the first embodiment.

FIG. 7(a) is a schematic view showing a head driving portion of the first embodiment, and FIG. 7(b) is a timing chart showing a driving signal, a selection signal, and an ejection signal in the head driving portion.

FIG. 8(a) and FIG. 8(b) are schematic views showing an order when ejecting droplets from a head group of the first embodiment.

FIG. 14(a) through FIG. 14(d) are schematic views showing a manufacturing method of the second embodiment.

FIG. 15(a) and FIG. 15(b) are schematic views showing a base body of a third embodiment.

FIG. 18(a) through FIG. 18(d) are schematic views showing a manufacturing method of the third embodiment.

FIG. 24(a) and FIG. 24(b) are schematic views showing a base body of a fifth embodiment.

FIG. 30 is a schematic view specifying a scanning range.

DETAILED DESCRIPTION

First Embodiment

Figure 2:
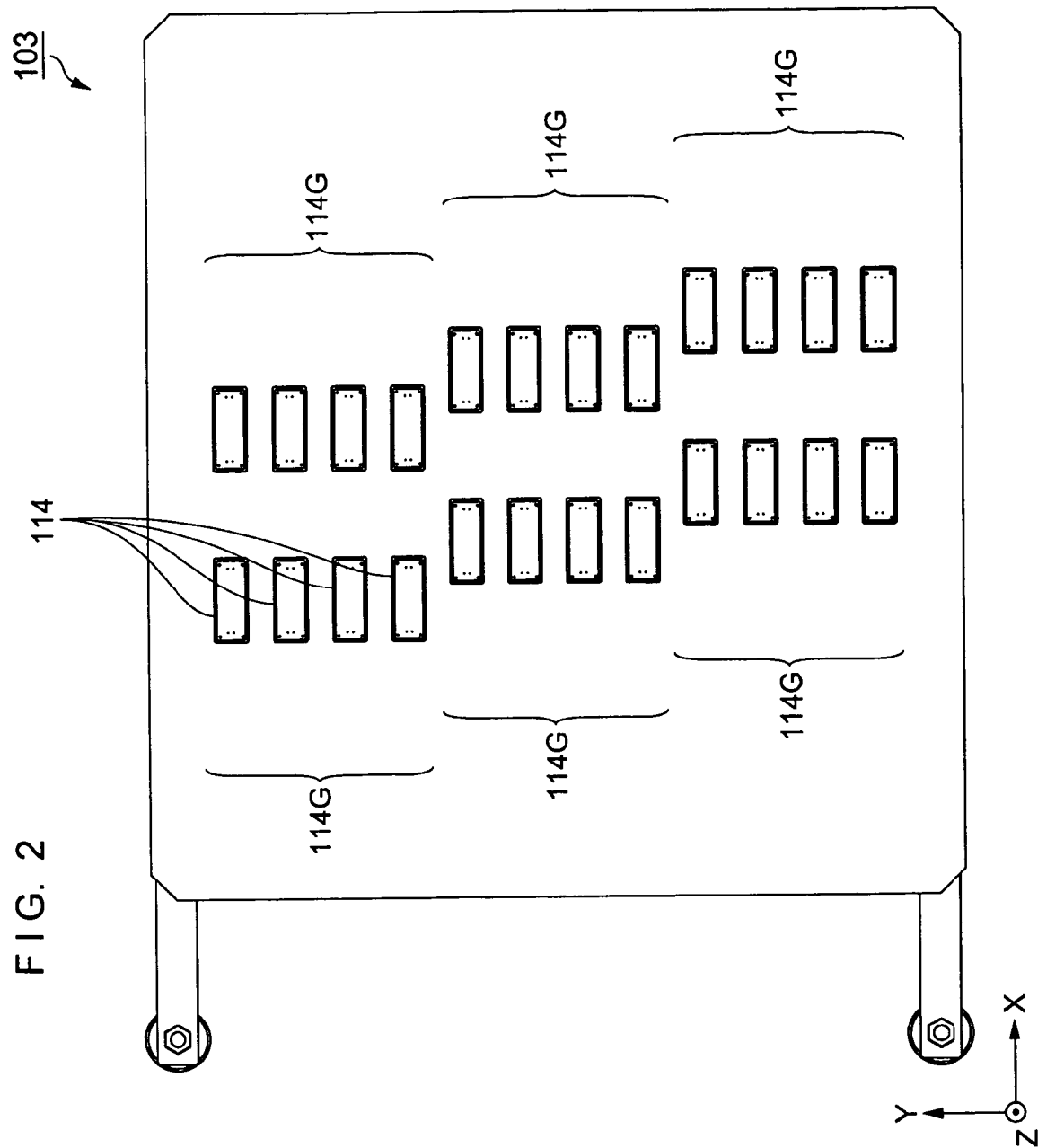
FIG. 2 is a schematic view showing a carriage of the first embodiment.

An ejecting apparatus and an ejecting method of this embodiment will now be described in order specified as follows:

A. Overall Configuration of Ejecting Apparatus
B. Carriage
C. Head
D. Head Groups
E. Control Portion
F. Example of Ejecting Method A. Overall Configuration of Ejecting Apparatus As shown in FIG. 1, an ejecting apparatus 100 includes a tank 101 to hold a liquid material 111, a tube 110, and an ejection scanning portion 102 to which the liquid material 111 is supplied from the tank 101 via the tube 110. The ejection scanning portion 102 includes a carriage 103 holding a plurality of heads 114 (FIG. 2), a first position control device 104 to control the position of the carriage 103, a stage 106 to hold a base body 10A described below, a second position control device 108 to control the position of the stage 106, and a control portion 112. The tank 101 and the plurality of heads 114 in the carriage 103 are connected through the tube 110, and the liquid material 111 is supplied to each of the plurality of heads 114 from the tank 101 by compressed air.

The first position control device 104 moves the carriage 103 along the X-axis direction and the Z-axis direction that intersects with the X-axis direction at a right angle according to a signal from the control portion 112. Further, the first position control device 104 is furnished with a function of rotating the carriage 103 about an axis parallel to the Z-axis. In this embodiment, the Z-axis direction is a direction parallel to the vertical direction (that is, a direction of gravitational acceleration). The second position control device 108 moves the stage 106 along the Y-axis direction that intersects with both the X-axis direction and the Z-axis direction at right angles according to a signal from the control portion 112. Further, the second position control device 108 is furnished with a function of rotating the stage 106 about an axis parallel to the Z-axis. In this specification, the first position control device 104 and the second position control device 108 are occasionally referred to as "a scanning portion".

The stage 106 includes a plane surface parallel to both the X-axis direction and the Y-axis direction. Also, the stage 106 is configured to be able to fix or hold a base body, having ejected portions to which a specific material is to be applied, on this plane surface. In this specification, the base body having ejected portions is occasionally referred to as "a reception substrate".

The X-axis direction, the Y-axis direction, and the Z-axis direction referred to in this specification agree with a direction in which either the carriage 103 or the stage 106 moves relatively with respect to the other. A virtual original point of the XYZ coordinate system that defines the X-axis direction, the Y-axis direction, and the Z-axis direction is fixed in the reference portion of the ejecting apparatus 100. The X-coordinate, the Y-coordinate, and the Z-coordinate referred to in this specification mean coordinates in the XYZ coordinate system described as above. The virtual original point may be fixed to the stage 106 or to the carriage 103 instead of the reference portion.

As has been described, the carriage 103 is moved in the X-axis direction by the first position control device 104. Meanwhile, the stage 106 is moved in the Y-axis direction by the second position control means 108. In short, the relative positions of the heads 114 with respect to the stage 106 are changed by the first position control device 104 and the second position control device 108. To be more specific, due to these operations, the carriage 103, head groups 114G (FIG. 2), the heads 114, or nozzles 118 (FIG. 3) move, that is, scan in the X-axis direction and the Y-axis direction relatively with respect to ejected portions positioned on the stage 106 while keeping a predetermined distance in the Z-axis direction. Alternatively, the carriage 103 may move in the Y-axis direction with respect to the stationary ejected portions, so that the material 111 may be ejected from the nozzles 118 to the stationary ejected portions during a period for the carriage 103 to move from a specific point to another specific point along the Y-axis direction. The term "move relatively" or "scan relatively" includes an operation causing either the side from which the liquid material 111 is ejected or the side (ejected portions side) onto which ejected substances will land, to move with respect to the other.

Further, the phrase "the carriage 103, the head groups 114G (FIG. 2), the heads 114, or the nozzles 118 (FIG. 3) move relatively" means that the relative positions of the foregoing components with respect to the stage, the base body, or the ejected portions are changed. Hence, in this specification, even in a case where the stage 106 alone moves while the carriage 103, the head groups 114G, the heads 114, or the nozzles 118 remain stationary with respect to the ejecting apparatus 100, it is described that the carriage 103, the head groups 114G, the heads 114, or the nozzles 118 move relatively with respect to the stage 106, the base body, or the ejected portions. Also, relative scanning or relative movement and ejection of a material, when combined, are occasionally referred to as "application by scanning".

The carriage 103 and the stage 106 further have a degree of freedom as to parallel movements and rotations in addition to the degree of freedom described above. It should be noted, however, that a description of a degree of freedom other than the degree of freedom described above is omitted in this embodiment for ease of explanation.

The control portion 112 is configured to receive ejection data, indicating relative positions to which the liquid material 111 is to be ejected, from an external information processing apparatus. The configuration and functions of the control portion 112 will be described in detail below.

B. Carriage

FIG. 2 is a view of the carriage 103 when observed from the stage 106 side. A direction perpendicular to the sheet surface of FIG. 2 is defined as the Z-axis direction. Also, the horizontal direction of the sheet surface of FIG. 2 is defined as the X-axis direction and the vertical direction of the sheet surface is defined as the Y-axis direction.

As shown in FIG. 2, the carriage 103 holds a plurality of heads 114 each having substantially the same structure. In this embodiment, 24 heads 114 are held by the carriage 103. Each head 114 includes a bottom surface provided with a plurality of nozzles 118 described below. The bottom surface of each head 114 is a polygonal shape having two long sides and two short sides. As shown in FIG. 2, the bottom surface of the head 114 held by the carriage 103 faces the stage 106, and further, the direction of the long sides and the direction of the short sides of the head 114 are parallel to the X-axis direction and the Y-axis direction, respectively. The relative locations among the heads 114 will be described in detail below.

In this specification, four heads 114 adjacent to each other in the Y-axis direction are occasionally referred to as "a head group 114G". When this term is used, it may be described that the carriage 103 of FIG. 2 holds six head groups 114G.

C. Head

Figure 3:
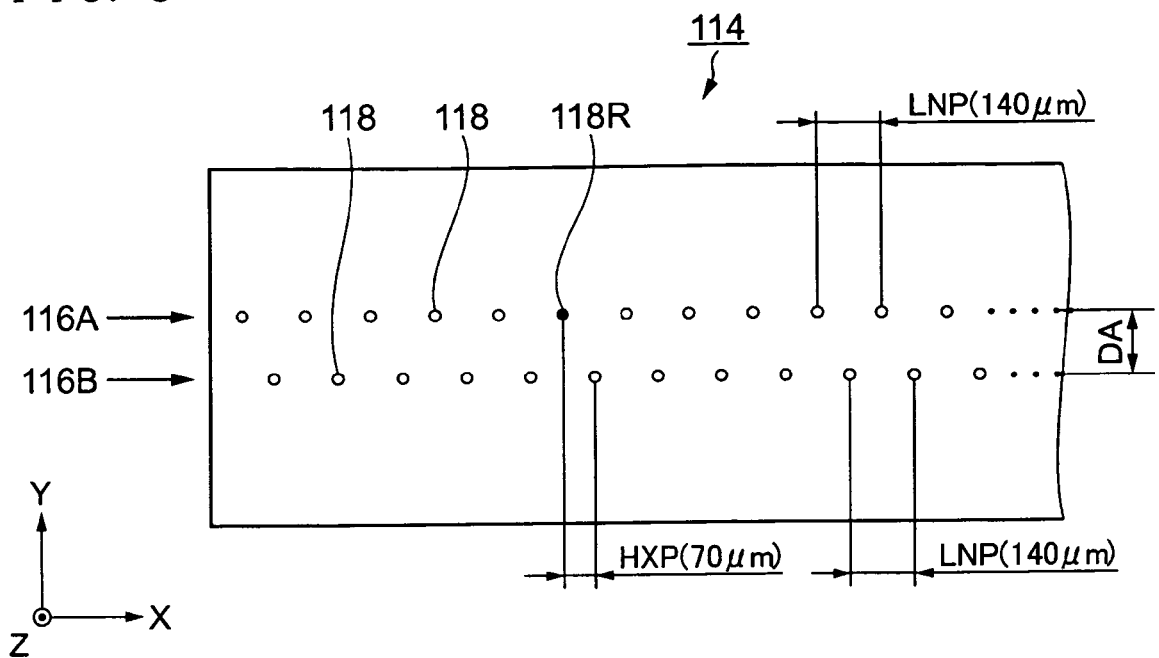
FIG. 3 is a schematic view showing a head of the first embodiment.

FIG. 3 shows the bottom surface of the head 114. The head 114 includes a plurality of nozzles 118 aligned in the X-axis direction. The plurality of nozzles 118 are placed in such a manner that a nozzle pitch HXP in the X-axis direction of the head 114 is about 70 µm. Herein, "a nozzle pitch HXP in the X-axis direction of the head 114" is equivalent to pitches among a plurality of nozzle images obtained by throwing projection images of all the nozzles 118 in the head 114 along the Y-axis direction to be formed on the X-axis.

In this embodiment, the plurality of nozzles 118 in the head 114 form a nozzle array 116A and a nozzle array 116B, both of which extend in the X-axis direction. The nozzle array 116A and the nozzle array 116B are adjacent to each other in the Y-axis direction. Also, DA equals a distance between the nozzle array 116A and the nozzle array 116B, that is, as a distance in the Y-axis direction. Referring to FIG. 3, the Y-coordinate of the nozzle array 116A is larger than the Y-coordinate of the nozzle array 116B. Also, in each of the nozzle array 116A and the nozzle array 116B, 90 nozzles 118 are aligned in a line at regular intervals in the X-axis direction. In this embodiment, the regular interval is about 140 µm. That is to say, a nozzle pitch LNP of the nozzle array 116A and a nozzle pitch LNP of the nozzle array 116B are both about 140 μm.

The position of the nozzle array 116B is shifted to the positive direction in the X-axis direction (to the right of FIG. 3) by half the length of the nozzle pitch LNP (about 70 μm) with respect to the position of the nozzle array 116A. A nozzle pitch HXP in the X-axis direction of the head 114 is thus half the length (about 70 μm) of the nozzle pitch LNP of the nozzle array 116A (or the nozzle array 116B).

Hence, the nozzle linear density in the X-axis direction of the head 114 is twice the nozzle linear density of the nozzle array 116A (or the nozzle array 116B). In this specification, "the nozzle linear density in the X-axis direction" is equivalent to the number of a plurality of nozzle images per unit length when projection images of a plurality of nozzles are thrown along the Y-axis direction to be formed on the X-axis.

It goes without saying that the number of nozzle arrays included in the head 114 is not limited to two. The head 114 may include M nozzle arrays, where M is a natural number equal to or greater than 1. In this case, in each of M nozzle arrays, a plurality of nozzles 118 are aligned at pitches M times longer than the nozzle pitch HXP. Further, when M is a natural number equal to 2 or greater, with respect to one of the M nozzle arrays, other (M−1) nozzle arrays are shifted, without being overlapped, in the X-axis direction by a length i times longer than the nozzle pitch HXP, where i is a natural number from 1 to (M−1).

Because each of the nozzle array 116A and the nozzle array 116B comprises ninety (90) nozzles 118, one head 114 has one hundred eighty (180) nozzles 118 in total. It should be noted, however, that five nozzles at each end of the nozzle array 116A are set as "rest nozzles". Likewise, five nozzles at each end of the nozzle array 116B are also set as "rest nozzles". From these 20 "rest heads", no liquid material 111 will be ejected. Hence, of all the 180 nozzles 118 in the head 114, 160 nozzles 118 function as nozzles from which the liquid material 111 is ejected. In this specification, these 160 nozzles 118 are occasionally referred to as "ejection nozzles".

It should be appreciated that the number of nozzles 118 in one head 114 is not limited to 180. For example, one head 114 may be provided with 360 nozzles. In this case, each of the nozzle arrays 116A and 116B comprises 180 nozzles 118. Also, the number of ejection nozzles is not limited to 160 in the invention. One head 114 may have P ejection nozzles, where P is a natural number equal to or greater than 2 up to a total number of the nozzles in the head 114.

In this specification, in order to explain the relative locations among the heads 114, of 90 nozzles 118 included in the nozzle array 116A, the sixth nozzle 118 from the left is referred to as "the reference nozzle 118R" in the head 114. That is to say, of 80 ejection nozzles in the nozzle array 116A, the ejection nozzle on the left edge is "the reference nozzle 118R" in the head 114. "The reference nozzle 118R" can be set to a position other than the position specified above, provided that the "reference nozzle 118R" is specified in the same manner in all the heads 114.

As shown in FIG. 4(a) and FIG. 4(b), each head 114 comprises an ink jet head. To be more specific, each head 114 includes a diaphragm 126 and a nozzle plate 128. In a space between the diaphragm 126 and the nozzle plate 128 is positioned a liquid reservoir 129 that is always filled with the liquid material 111 supplied from the tank 101 through a hole 131.

Also, in a space between the diaphragm 126 and the nozzle plate 128 are positioned a plurality of partition walls 122. A cavity 120 is defined by a portion surrounded by the diaphragm 126, the nozzle plate 128, and a pair of partition walls 122. Because the cavities 120 are provided in a correspondence with the nozzles 118, the number of cavities 120 is equal to the number of nozzles 118. Each cavity 120 is supplied with the liquid material 111 from the liquid reservoir 129 via a supply port 130 positioned between a pair of partition walls 122.

On the diaphragm 126 are positioned transducers 124 in a correspondence with the respective cavities 120. Each transducer 124 includes a piezoelectric element 124C, and a pair of electrodes 124A and 124B sandwiching the piezoelectric element 124C. The liquid material 111 is ejected from the corresponding nozzle 118 by applying a driving voltage across the pair of electrodes 124A and 124B. The shape of the nozzle 118 is adjusted so that the liquid material 111 is ejected from the nozzle 118 in the Z-axis direction.

The term "liquid material" referred to in this specification means a viscous material that can be ejected from nozzles. In this case, the material can be based on either water or oil. It is sufficient for the material to have flowability (viscosity) so that it can be ejected from nozzles, and it may be mixed with solid substances as long as it remains fluid as a whole.

The control portion 112 (FIG. 1) may be configured to provide a signal to a plurality of transducers 124 independently. In other words, the volume of the material 111 to be ejected from the nozzles 118 may be controlled for each nozzle 118 according to a signal from the control portion 112. In such a case, the volume of the material 111 ejected from each nozzle 118 may vary from 0 pl to 42 pl (pico-liters). Also, as will be described below, the control portion 112 may set the nozzles 118 that perform ejection operations and the nozzles 118 that do not perform ejection operations during the application by scanning.

In this specification, a portion including one nozzle 118, the cavity 120 corresponding to the nozzle 118, and the transducer 124 corresponding to the cavity 120 is occasionally referred to as "an ejecting portion 127". When this term is used, it may be described that one head 114 includes as many ejecting portions 127 as the nozzles 118. Each ejecting portion 127 may include an electrothermal converting element instead of a piezoelectric element. In other words, the ejecting portion 127 may be configured in a manner so as to eject a material through the use of thermal expansion of the material induced by the electrothermal converting element.

D. Head Groups

Figure 5:
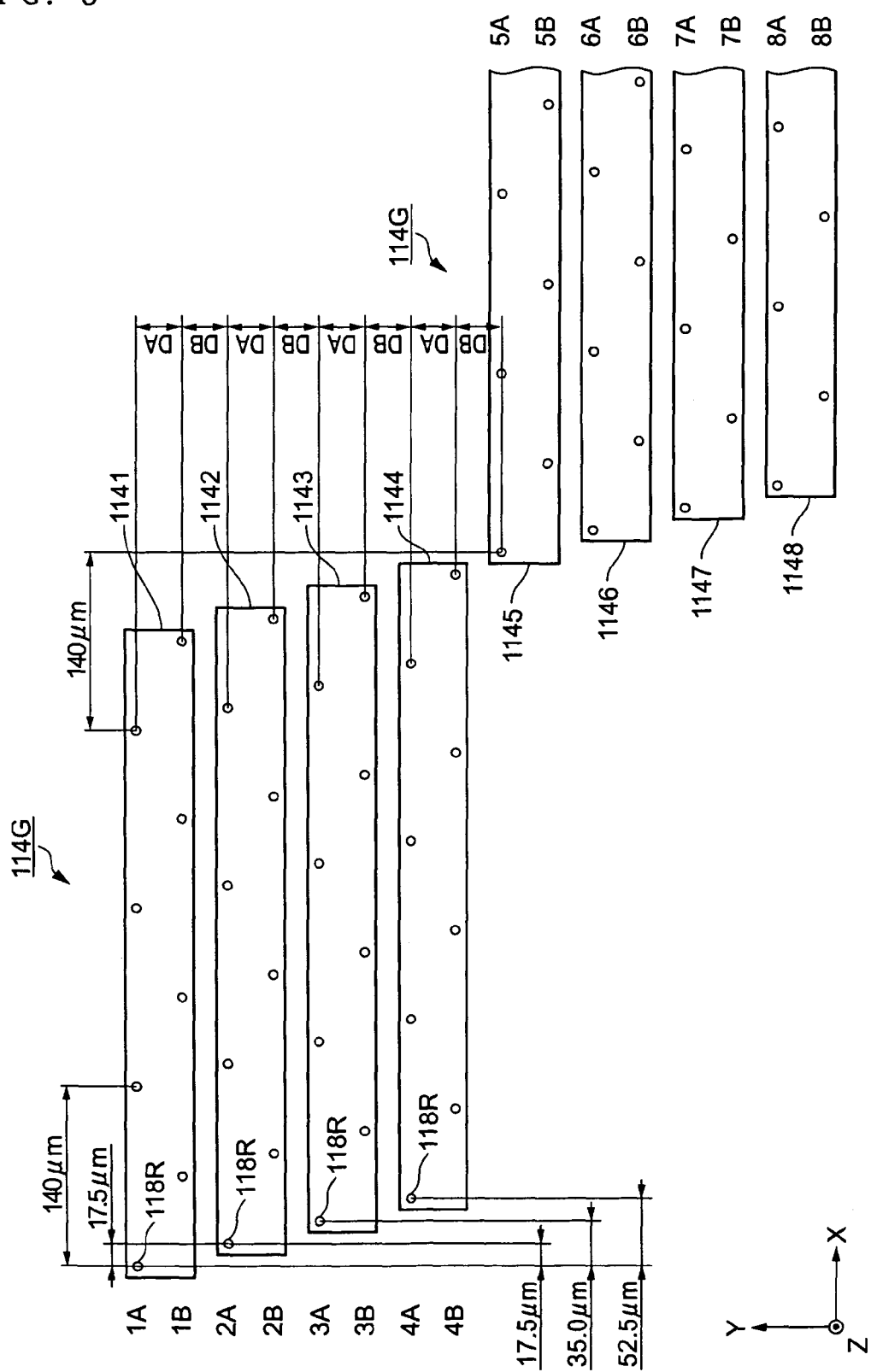
FIG. 5 is a schematic view showing relative locations among the heads in head groups of the first embodiment.

Relative locations among four heads 114 in a head group 114G will now be described. FIG. 5 shows two head groups 114G adjacent to each other in the Y-axis direction in the carriage 103 of FIG. 2.

As shown in FIG. 5, each head group 114G comprises four heads 114. Four heads 114 are placed in the head group 114 in such a manner that a nozzle pitch GXP in the X-axis direction of the head group 114G is ¼ the length of the nozzle pitch HXP in the X-axis direction of the head 114. To be more specific, with respect to the X-coordinate of the reference nozzle 118R in one head 114, the X-coordinates of the reference nozzles 118R in the other heads 114 are at positions shifted, without being overlapped, in the X-axis direction by j/4 the length of the nozzle pitch HXP, where j is a natural number from 1 to 3. Hence, the nozzle pitch GXP in the X-axis direction of the head group 114G is ¼ of the nozzle pitch HXP.

In this embodiment, because the nozzle pitch HXP in the X-axis direction of the head 114 is about 70 μm, the nozzle pitch GXP in the X-axis direction of the head group 114G is ¼ of that pitch, that is, about 17.5 μm. Herein, "the nozzle pitch GXP in the X-axis direction of the head group 114G" is equivalent to pitches among a plurality of nozzle images obtained by throwing projection images of all the nozzles 118 in the head group 114G along the Y-axis direction to be formed on the X-axis.

It goes without saying that the number of heads 114 included in a head group 114G is not limited to four. A head group 114G may comprise N heads 114, where N is a natural number equal to or greater than 2. In this case, N heads 114 are placed in a head group 114G in such a manner that the nozzle pitch GXP is 1/N the length of the nozzle pitch HXP. Alternatively, with respect to the X-coordinate of the reference nozzle 118R in one of the N heads 114, the X-coordinates of the reference nozzles 118 in other (N−1) heads 114 may be shifted, without being overlapped, by j/N the length of the nozzle pitch HXP, where j is a natural number from 1 to (N−1).

The relative locations among the heads 114 in this embodiment will now be described more particularly.

For ease of explanation, four heads 114 included in a head group 114G on the upper left of FIG. 5 are denoted as a head 1141, a head 1142, a head 1143, and a head 1144 along the negative direction in the Y-axis direction (from top to bottom in FIG. 5). Likewise, four heads 114 included in a head group 114G on the lower right of FIG. 5 are denoted as a head 1145, a head 1146, a head 1147, and a head 1148 from top to bottom.

The nozzle arrays 116A and 116B in the head 1141 are denoted as nozzle arrays 1A and 1B, respectively. The nozzle arrays 116A and 116B in the head 1142 are denoted as nozzle arrays 2A and 2B, respectively. The nozzle arrays 116A and 116B in the head 1143 are denoted as nozzle arrays 3A and 3B, respectively. The nozzle arrays 116A and 116B in the head 1144 are denoted as nozzle arrays 4A and 4B, respectively. Likewise, the nozzle arrays 116A and 116B in the head 1145 are denoted as nozzle arrays 5A and 5B, respectively. The nozzle arrays 116A and 116B in the head 1146 are denoted as nozzle arrays 6A and 6B, respectively. The nozzle arrays 116A and 116B in the head 1147 are denoted as nozzle arrays 7A and 7B, respectively. The nozzle arrays 116A and 116B in the head 1148 are denoted as nozzle arrays 8A and 8B, respectively.

Each of the nozzle arrays 1A through 8B actually comprises 90 nozzles 118. Also, as has been described, in each of the nozzle arrays 1A through 8B, 90 nozzles are aligned in the X-axis direction. FIG. 5 shows, however, a case where each of the nozzle arrays 1A through 8B comprises four ejection nozzles (nozzles 118) for ease of explanation. In addition, referring to FIG. 5, the nozzle 118 on the left edge in the nozzle array 1A is the reference nozzle 118R in the head 1141, the nozzle 118 on the left edge in the nozzle array 2A is the reference nozzle 118R in the head 1142, the nozzle 118 on the left edge in the nozzle array 3A is the reference nozzle 118R in the head 1143, the nozzle 118 on the left edge in the nozzle array 4A is the reference nozzle 118R in the head 1144, and the nozzle 118 on the left edge in the nozzle array 5A is the reference nozzle 118R in the head 1145.

The position (or the X-coordinate) of the reference nozzle 118R in the head 1142 is shifted to the positive direction in the X-axis direction (to the right of FIG. 5) by about 17.5 μm from the position (or the X-coordinate) of the reference nozzle 118R in the head 1141. Also, the position of the reference nozzle 118R in the head 1143 is shifted to the positive direction in the X-axis direction by about 17.5 μm from the position of the reference nozzle 118R in the head 1142. Further, the position of the reference nozzle 118R in the head 1144 is shifted to the positive direction in the X-axis direction by about 17.5 μm from the position of the reference nozzle 118R in the head 1143. A direction in which a given head is shifted with respect to another head is not limited to the positive direction in the X-axis direction, and it may be the negative direction (to the left of FIG. 5) instead.

When placed as described above, the X-coordinate of the nozzle 118 on the left edge in the nozzle array 2A, the X-coordinate of the nozzle 118 on the left edge in the nozzle array 3A, and the X-coordinate of the nozzle 118 on the left edge in the nozzle array 4A fall within a space between the X-coordinate of the nozzle 118 on the left edge in the nozzle array 1A and the X-coordinate of the nozzle 118 on the left edge in the nozzle array 1B. Likewise, the X-coordinate of the nozzle 118 on the left edge in the nozzle array 2B, the X-coordinate of the nozzle 118 on the left edge in the nozzle array 3B, and the X-coordinate of the nozzle 118 on the left edge in the nozzle array 4B fall within a space between the X-coordinate of the nozzle 118 on the left edge in the nozzle array 1B and the X-coordinate of the second nozzle 118 from the left in the nozzle array 1A. In the same manner, the X-coordinate of a nozzle 118 in the nozzle array 2A (or 2B), the X-coordinate of a nozzle 118 in the nozzle array 3A (or 3B), and the X-coordinate of a nozzle 118 in the nozzle array 4A (or 4B) also fall within a space between the X-coordinate of another nozzle 118 in the nozzle array 1A and the X-coordinate of another nozzle 118 in the nozzle array 1B.

In this embodiment, the X-coordinates of the reference nozzles in the heads 1142, 1143, and 1144 are shifted with respect to the X-coordinate of the reference nozzle 118R in the head 1141 by ¼ the length of the nozzle pitch HXP, ²⁄₄ the length of the nozzle pitch HXP, and ¾ length of the nozzle pitch HXP, respectively. It should be appreciated, however, that the placement of four heads 114 is not limited to the placement as described above, and it is sufficient that with respect to the X-coordinate of the reference nozzle 118R in one nozzle head 114, the X-coordinates of the reference nozzles 118R in other heads are at positions shifted, without being overlapped, in the X-axis direction by j/4 the length of the nozzle pitch HXP, where j is a natural number from 1 to 3.

The placement, that is, the configuration, of the heads 1145, 1146, 1147, and 1148 in the head group 114G at the lower right of FIG. 5 is the same as the placement of the heads 1141, 1142, 1143, and 1144.

The relative location between two head groups 114G adjacent to each other in the X-axis direction will now be described on the basis of the relative location between the head 1145 and the head 1141.

The position of the reference nozzle 118R in the head 1145 is shifted to the positive direction in the X-axis direction by a length equal to a product of the nozzle pitch HXP in the X-axis direction of the head 114 and the number of ejection nozzles in the head 114, from the position of the reference nozzle 118R in the head 1141. In this embodiment, the nozzle pitch HXP is about 70 μm, and the number of ejection nozzles in one head 114 is 160. Hence, the position of the reference nozzle 118R in the head 1145 is shifted to the positive direction in the X-axis direction by 11.2 mm (70 μm×160) from the position of the reference nozzle 118R in the head 1141. However, because the number of ejection nozzles in the head 1141 is 8 in FIG. 5 for ease of explanation, the position of the reference nozzle 118R in the head 1145 is shifted in the X-axis direction by 560 μm (70 μm×8) from the position of the reference nozzle 1141 in the head 1141.

Because the head 1141 and the head 1145 are placed as described above, the X-coordinate of the ejection nozzle on the right edge in the nozzle array 1A and the X-coordinate of the ejection nozzle on the left edge in the nozzle array 5A are shifted by the nozzle pitch LNP. Hence, the overall nozzle pitch in the X-axis direction of the two head groups 114G is ¼ of the nozzle pitch HXP in the X-axis direction of the head 114.

Also, six head groups 114G are placed in such a manner that 17.5 μm, that is, ¼ of the nozzle pitch HXP in the X-axis direction of the head 114, equals the nozzle pitch in the X-axis direction of the overall carriage 103.

Further, in this embodiment, DA equals a distance between the nozzle array 116A and the nozzle array 116B in each of the plurality of heads 114 (1141 through 1148 of FIG. 5). As has been described with reference to FIG. 3, the Y-coordinate of the nozzle array 116A is larger than the Y-coordinate of the nozzle array 116B. In this specification, a distance between the nozzle array 116A and the nozzle array 116B in one head 114 is referred to as "a first distance between nozzle arrays, DA".

Meanwhile, DB equals a distance between the nozzle array 116B in one arbitrary head 114 and the nozzle array 116A in another head 114 adjacent to this arbitrary head in the Y-axis direction. In this specification, this distance is referred to as "a second distance between nozzle arrays, DB". In the case of FIG. 5, DB is a distance between the nozzle array 116B (referred to as 1B in FIG. 5) in the head 1141 and the nozzle array 116A (referred to as the array 2A in FIG. 5) in the head 1142. Further, DB is also a distance between the nozzle array 116B (referred to as the nozzle array 2B in FIG. 5) in the head 1142 and the nozzle array 116A (referred to as the nozzle array 3A in FIG. 5) in the head 1143. Likewise, DB is a distance between the nozzle array 3B and the nozzle array 4A and a distance between the nozzle array 4B and the nozzle array 5A.

In this embodiment, four heads 114 are placed in a head group 114G in such a manner that the second distance between nozzle arrays, DB, is substantially equal to an integer multiple of the first distance between nozzle arrays, DA. For example, a distance between the nozzle array 1B and the nozzle array 2A is substantially equal to an integer multiple of the first distance between nozzle arrays, DA. Further, as to the placement of the heads 1141 and 1142, because a distance between the nozzle array 1B and the nozzle array 2A is substantially equal to an integer multiple of the first distance between nozzle arrays, DA, a distance between the nozzle array 1A and the nozzle array 2A, a distance between the nozzle array 1B and the nozzle array 2B, and a distance between the nozzle array 1A and the nozzle array 2B are substantially equal to an integer multiples of the first distance between nozzle arrays, DA.

A distance between the nozzle arrays in the placement of two heads adjacent to each other in the Y-axis direction is equal to a distance between the nozzle arrays in the placement of the heads 1141 and 1142. In other words, a distance in the Y-axis direction between one nozzle array in one of the two heads adjacent to each other in the Y-axis direction and one nozzle array in the other head is an integer multiple of the first distance between nozzle arrays.

E. Control Portion

Figure 6:
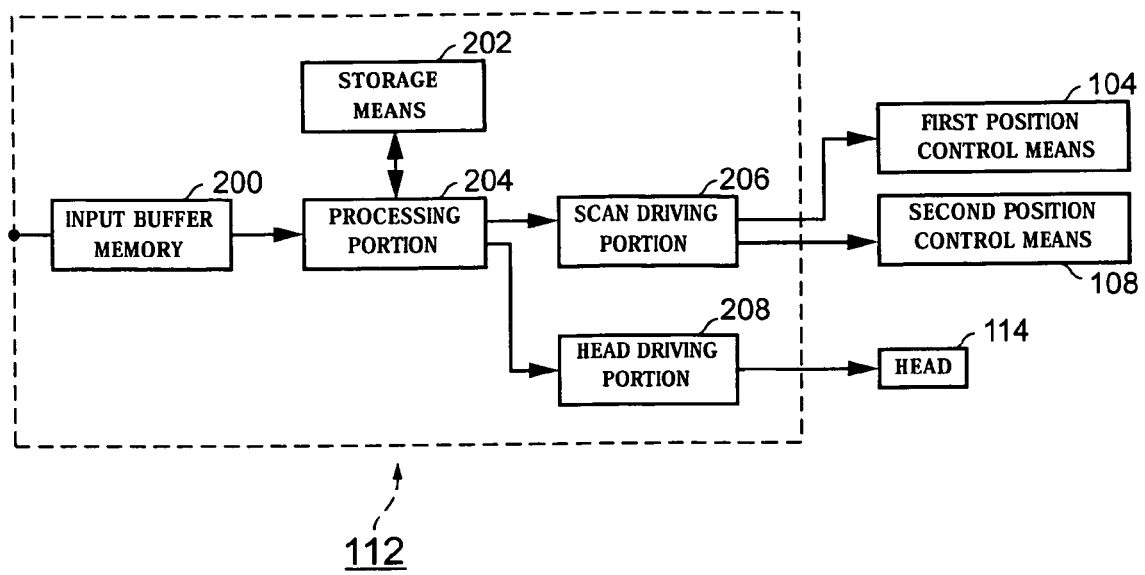
FIG. 6 is a schematic view showing a control portion of the first embodiment.

The configuration of the control portion 112 will now be described. As shown in FIG. 6, the control portion 112 includes an input buffer memory 200, storage means 202, a processing portion 204, a scan driving portion 206, and a head driving portion 208. The buffer memory 202 and the processing portion 204 are connected to enable mutual communications. The processing portion 204 and the storage means 202 are connected to enable mutual communications. The processing portion 204 and the scan driving portion 206 are connected to enable mutual communications. The processing portion 204 and the head driving portion 20 are connected to enable mutual communications. The scan driving portion 206 is connected to both the first position control means 104 and the second position control means 108 to enable mutual communications. Likewise, the head driving portion 208 is connected to each of the plurality of heads 114 to enable mutual communications independently.

The input buffer memory 200 receives ejection data, according to which droplets of the liquid material 111 are ejected, from an external information processing apparatus. The ejection data includes: data indicating relative positions of all ejected portions on the base body; data indicating relative scanning times needed to apply the liquid material 111 to all the ejected portions in a desired thickness; data specifying nozzles 118 to function as ON nozzles 118A; and data specifying nozzles 118 to function as OFF nozzles 118B. The ON nozzles 118A and the OFF nozzles 118B will be described below. The input buffer memory 200 supplies the processing portion 204 with the ejection data, and the processing portion 204 stores the ejection data into the storage means 202. The storage means 202 of FIG. 6 comprises a RAM.

The processing portion 204 provides the scan driving portion 206 with data indicating the relative positions of the nozzles 118 with respect to the ejected portions, on the basis of the ejection data in the storage means 202. The scan driving portion 206 provides the first position control means 104 and the second position control means 108 with driving signals, which correspond to the data provided as described above and an ejection period EP (FIG. 7) described below. This causes the heads 114 to scan relatively with respect to the ejected portions. Meanwhile, the processing portion 204 provides the head driving portion 208 with a selection signal SC that specifies ON/OFF state of the nozzles 118 at each ejection timing, on the basis of the ejection data stored in the storage means 202 and the ejection period EP. The head driving portion 208 provides the heads 114 with an ejection signal ES needed to eject the liquid material 111, on the basis of the selection signal SC. The liquid material 111 is thus ejected from the corresponding nozzles 118 in the heads 114 in the form of droplets.

The control portion 112 may comprise a computer including a CPU, a ROM, and a RAM. In this case, the foregoing functions of the control portion 112 are achieved by software programs run by the computer. It goes without saying that the control portion 112 can be achieved by a specific circuit (hardware).

The configuration and the functions of the head driving portion 208 in the control portion 112 will now be described.

As shown in FIG. 7(a), the head driving portion 208 includes one driving signal generating portion 203 and a plurality of analog switches AS. The driving signal generating portion 203 generates a driving signal DS as shown in FIG. 7(b). The potential of the driving signal DS varies with time with respect to the reference potential L. To be more specific, the driving signal DS includes a plurality of ejection waveforms P that are repeated in the ejection periods EP. Herein, the ejection waveforms P correspond to driving voltage waveforms to be applied across a pair of electrodes in a corresponding transducer 124 for a single droplet to be ejected from the nozzle 118.

The driving signal DS is supplied to the input terminals of the respective analog switches AS. The analog switches AS are provided to respectively correspond to the ejecting portions 127. In short, the number of analog switches AS is equal to the number of ejecting portions 127 (that is, the number of nozzles 118).

The processing portion 204 provides the respective analog switches AS with the selection signals SC indicating the ON/OFF state of the corresponding nozzles 118. Herein, the selection signals SC take either a high level or low level state for each analog switch AS. Meanwhile, each analog switch AS supplies the ejection signal ES to the electrode 124A of the transducer 124 according to the driving signal DS and the selection signal SC. To be more specific, when the selection signal SC is at the high level, the analog switch AS propagates the driving signal DS to the electrode 124A as the ejection signal ES. On the other hand, when the selection signal SC is at the low level, the potential of the ejection signal ES outputted from the analog switch AS becomes the reference potential L. When the driving signal DS is provided to the electrode 124A of the transducer 124, the liquid material 111 is ejected from the nozzle 118 corresponding to the transducer 124. The reference potential L is provided to the electrode 124B in each transducer 124.

In the case shown in FIG. 7(b), a high level period and a low level period are set in two selection signals SC in such a manner that the ejection waveform P appears in a period 2EP, which is twice the ejection period EP, in each of the two ejection signals ES. The liquid material 111 is thus ejected in the period 2EP from each of the corresponding two nozzles 118. Also, a common driving signal DS from the common driving signal generating portion 203 is provided to each of the transducers 124 corresponding to these two nozzles 118. The liquid material 111 is therefore ejected from the two nozzles 118 at substantially the same timing.

The ejecting apparatus 100, configured as described above, thus applies the liquid material 111 by scanning (application by scanning) according to the ejection data provided to the control portion 112.

F. Example of Ejecting Method

With reference to FIG. 8(a) and FIG. 8(b), a method by which the ejecting apparatus 100 ejects the liquid material 111 to a stripe-shaped target, that is, an ejected portion 18L, parallel to the X-axis direction will now be described. To be more specific, the following description will describe an applying method of a liquid material, including a step of moving the carriage 103 in the Y-axis direction relatively with respect to the stage 106, while maintaining a distance between a second nozzle array in one arbitrary head in a head group 114G, or the carriage 103 and a first nozzle array in another head adjacent to the arbitrary head to be substantially equal to an integer multiple of the first distance between nozzle arrays, DA.

In the case shown in FIG. 8(a), the heads 1141, 1142, 1143, 1144, and 1145, which have been described with reference to FIG. 5, overlap the ejected portion 18L in this order as the carriage 103 moves relatively in the Y-axis direction.

As has been described with reference to FIG. 5, in this embodiment, the second distance between nozzle arrays, DB, is substantially equal to an integer multiple of the first distance between nozzle arrays, DA, which is thereby expressed as:

$$DB = c_1 \cdot DA \quad \text{(Equation 1)}$$

where $c_1$ is an integer.

In this embodiment, a relative movement velocity V of the carriage 103 with respect to the stage 106 is set to satisfy:

$$V = DA/(c_2 \cdot EP) \quad \text{(Equation 2)}$$

where DA is the first distance between nozzle arrays, EP is the ejection period shown in FIG. 7, and $c_2$ is an integer.

Because the relative movement velocity V satisfies Equation 2 above, the nozzle array 1A and the nozzle array 1B (FIG. 5) overlap the ejected portion 18L at a time interval equal to an integer ($c_2$) multiple of the ejection period EP.

Moreover, in this embodiment, because the second distance between the nozzle arrays, DB, is an integer ($c_1$) multiple of the first distance between nozzle arrays, DA, the nozzle array 2A (FIG. 5) overlaps the ejected portion 18L at a time interval equal to an integer ($c_1 \cdot c_2$) multiple of the ejection period EP from the time point at which the nozzle array 1B overlaps the ejected portion 18L. All the nozzle arrays in a head group 114G overlap the ejected portion 18L at time intervals equal to integer multiples of the ejection period EP in the same manner.

Hence, all the nozzle arrays overlap the ejected portion 18L or enter a region corresponding to the ejected portion 18L in the same phase in relative to the ejection period EP. For this reason, the driving signal generating portion 203 can be used commonly to the nozzles 118 in all the nozzle arrays. It is thus possible to make the circuit configuration simple while maintaining the accuracy of the ejection waveform (driving waveform).

As shown in FIG. 8(a), the carriage 103 first starts to move in the Y-axis direction relatively with respect to the stage 106. When the nozzle array 1A overlaps the ejected portion 18L, the material 111 is ejected to the ejected portion 18L from the nozzles 118 included in the nozzle array 1A concurrently.

The landing positions when ejected from the nozzle array 1A are indicated by black circles on the right of the label "1A" in FIG. 8(b). As shown in FIG. 8(b), the liquid material 111, when ejected from the nozzle array 1A, lands on the ejected portion 18L at a pitch on the order of 140 μm in the X-axis direction.

The nozzle array 1B overlaps the ejected portion 18L after a time period equal to an integer multiple ($c_2$ times) of the ejection period EP from the time point at which the nozzle array 1A overlaps the ejected portion 18L. When the nozzle array 1B overlaps the ejected portion 18L, the liquid material 111 is ejected to the ejected portion 18L from the nozzles 118 included in the nozzle array 1B concurrently. The landing positions when ejected from the nozzle array 1B are indicated by black circles on the right of the label "1B" in FIG. 8(b). As shown in FIG. 8(b), the liquid material 111, when ejected from the nozzle array 1B, lands on the ejected portion 18L at a pitch on the order of 140 μm in the X-axis direction. It should be noted, however, that a distance between the landing positions when ejected from the nozzle array 1B and the landing positions when ejected from the nozzle array 1A preceding the nozzle array 1B is about 70 μm. The landing positions when ejected from the nozzle array preceding the nozzle array 1B are indicated by white circles on the right of the label "1B" in FIG. 8(b).

The nozzle array 2A overlaps the ejected portion 18L after a time period equal to an integer multiple ($c_1 \cdot c_2$ times) of the ejection period EP from the time point at which the nozzle array 1B overlaps the ejected portion 18L. When the nozzle array 2A overlaps the ejected portion 18L, the liquid material 111 is ejected to the ejected portion 18L from the nozzles 118 included in the nozzle array 2A concurrently. The landing positions when ejected from the nozzle array 2A are indicated by black circles on the right of the label "2A" in FIG. 8(b). As shown in FIG. 8(b), the liquid material 111, when ejected from the nozzle array 2A, lands on the ejected portion 18L at a pitch on the order of 140 μm in the X-axis direction. It should be noted, however, that the shortest distance between the landing positions when ejected from the nozzle array 2A and the landing positions when ejected from the nozzle array preceding the nozzle array 2A is about 17.5 μm. The landing positions when ejected from the nozzle array preceding the nozzle array 2A are indicated by white circles on the right of the label "2A" in FIG. 8(b).

The nozzle array 2B overlaps the ejected portion 18L after a time period equal to an integer multiple ($c_2$ times) of the ejection period EP from the time point at which the nozzle array 2A overlaps the ejected portion 18L. When the nozzle array 2B overlaps the ejected portion 18L, the liquid material 111 is ejected to the ejected portion 18L from the nozzles 118 included in the nozzle array 2B concurrently. The landing positions when ejected from the nozzle array 2B are indicated by black circles on the right of the label "2B" in FIG. 8(b). As shown in FIG. 8(b), the liquid material, when ejected from the nozzle array 2B, lands on the ejected portion 18L at a pitch on the order of 140 μg/m in the X-axis direction. It should be noted, however, that the shortest distance between the landing positions when ejected from the nozzle array 2B and the landing positions when ejected from the nozzle array preceding the nozzle array 2B is about 17.5 μm. The landing positions when ejected from the nozzle array preceding the nozzle array 2B are indicated by white circles on the right of the label "2B" in FIG. 8(b).

Thereafter, the nozzle arrays 3A, 3B, 4A, 4B, 5A, and 5B overlap the ejected portion 18L in this order, and the liquid material 111 is ejected to the ejected portion 18L from the respective nozzle arrays 3A, 3B, 4A, 4B, 5A, and 5B in the same manner as the nozzle arrays 1A, 1B, 2A, and 2B. Hence, while a head group 114G moves once in the Y-axis direction relatively with respect to the ejected portion 18L, the liquid material 111 lands at a pitch of 17.5 μm, that is, ¼ the length of the nozzle pitch HXP in the X-axis direction of the heads 114.

One example of the stripe-shaped ejected portion 18L is a portion where a metal wire is formed in an electronic device. Hence, the ejecting apparatus 100 of this embodiment is applicable to a wire manufacturing apparatus that manufactures a metal wire in an electronic device by ejecting a liquid wire material. For example, it can be applied to a wire manufacturing apparatus that forms address electrodes 54 on a supporting substrate 52 in a plasma display apparatus 50 (FIG. 21 and FIG. 22) described below.

According to this embodiment, in the ejecting apparatus 100, a plurality of nozzles 118 are aligned in a direction (X-axis direction) that intersects at right angles with a direction (Y-axis direction) in which the carriage 103 moves relatively. It is thus possible to eject the liquid material 111 to the ejected portion 18L, which extends in the X-axis direction, from a plurality of nozzles 118 substantially simultaneously. It is therefore sufficient to provide a single driving signal generating portion 203 that generates the driving signal DS for a plurality of nozzles 118. Also, because the ejection timings from the plurality of nozzles 118 aligned in one direction are substantially the same, there is no need for a circuit configuration to delay the driving signal DS from the driving signal generating portion 203. This reduces factors that give rise to a round waveform in the driving signal DS, which in turn makes it possible to apply a precise ejection waveform P to the transducer 124. Ejection of the liquid material 111 from the nozzles 118, therefore, becomes more stable.

Also, according to this embodiment, in the ejecting apparatus 100, the nozzle pitch in the X-axis direction of a head group 114G is 1/N the length of the nozzle pitch in the X-axis direction of the head, where N is the number of heads 114 included in the head group 114G. Hence, the nozzle linear density in the X-axis direction of the ejecting apparatus 100 is higher than the nozzle linear density in the X-axis direction of a normal ink jet apparatus. It is thus possible to form a finer landing pattern along the X-axis direction within a period for the carriage 103 to move relatively once in the Y-axis direction.

Second Embodiment

An example when the invention is applied to a manufacturing system of a color filter substrate will now be described.

A base body 10A shown in FIG. 9(a) and FIG. 9(b) is a substrate that will be made into a color filter substrate 10 through treatments applied in a manufacturing system 1 (FIG. 10) described below. The base body 10A includes a plurality of ejected portions 18R, 18G, and 18B placed in a matrix fashion.

To be more specific, the base body 10A includes a light-transmitting supporting substrate 12, a black matrix 14 formed on the supporting substrate 12, and a bank 16 formed on the black matrix 14. The black matrix 14 is made of a light-shielding material. The black matrix 14 and the bank 16 on the black matrix 14 are positioned in such a manner that a matrix of a plurality of light-transmitting portions, that is, a matrix of a plurality of pixel regions, are defined on the supporting substrate 12.

In the respective pixel regions, concave portions defined by the supporting substrate 12, the black matrix 14, and the bank 16 correspond to ejected portions 18R, ejected portions 18G, and ejected portions 18B. The ejected portions 18R are regions where a filter layer 111FR that transmits only a ray of light in a wavelength range for red should be formed. The ejected portions 18G are regions where a filter layer 111FG that transmits only a ray of light in a wavelength range for green should be formed. The ejected portions 18B are regions where a filter layer 111FB that transmits only a ray of light in a wavelength range for blue should be formed.

The base body 10A shown in FIG. 9(b) is positioned on a virtual plane parallel to both the X-axis direction and the Y-axis direction. The row direction and the column direction of the matrix comprising a plurality of ejected portions 18R, 18G, and 18B are parallel to the X-axis direction and the Y-axis direction, respectively. In the base body 10A, the ejected portion 18R, the ejected portion 18G, and the ejected portion 18B are aligned in the Y-axis direction periodically in this order. Meanwhile, the ejected portions 18R are aligned in a line at predetermined, regular intervals in the X-axis direction. Also, the ejected portions 18G are aligned in a line at predetermined, regular intervals in the X-axis direction, and the ejected portions 18B are aligned in a line at predetermined, regular intervals in the X-axis direction. The X-axis direction and the Y-axis direction intersect with each other at a right angle.

A regular interval LRY along the Y-axis direction, that is, a pitch, among the ejected portions 18R is about 560 μm. This interval is equal to a regular interval LGY along the Y-axis direction among the ejected portions 18G as well as a regular interval LBY along the Y-axis direction among the ejected portions 18B. The plane image of each ejected portion 18R is a rectangular shape determined by long sides and short sides. To be more specific, the length of the Y-axis direction of each ejected portion 18R is about 100 μm and the length in the X-axis direction is about 300 μm. The ejected portions 18G and the ejected portions 18B are the same as the ejected portions 18R in shape and size. The intervals among the ejected portions and the size of the ejected portions correspond to the intervals and the size of the pixel regions for the corresponding colors in about a 40-inch high-definition TV.

Figure 9:
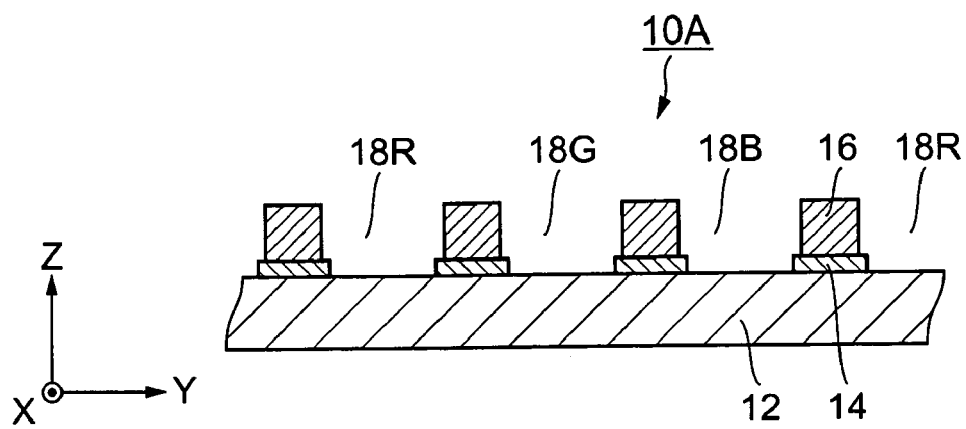
FIG. 9(a) and FIG. 9(b) are schematic views showing a base body of a second embodiment.
Figure 9:
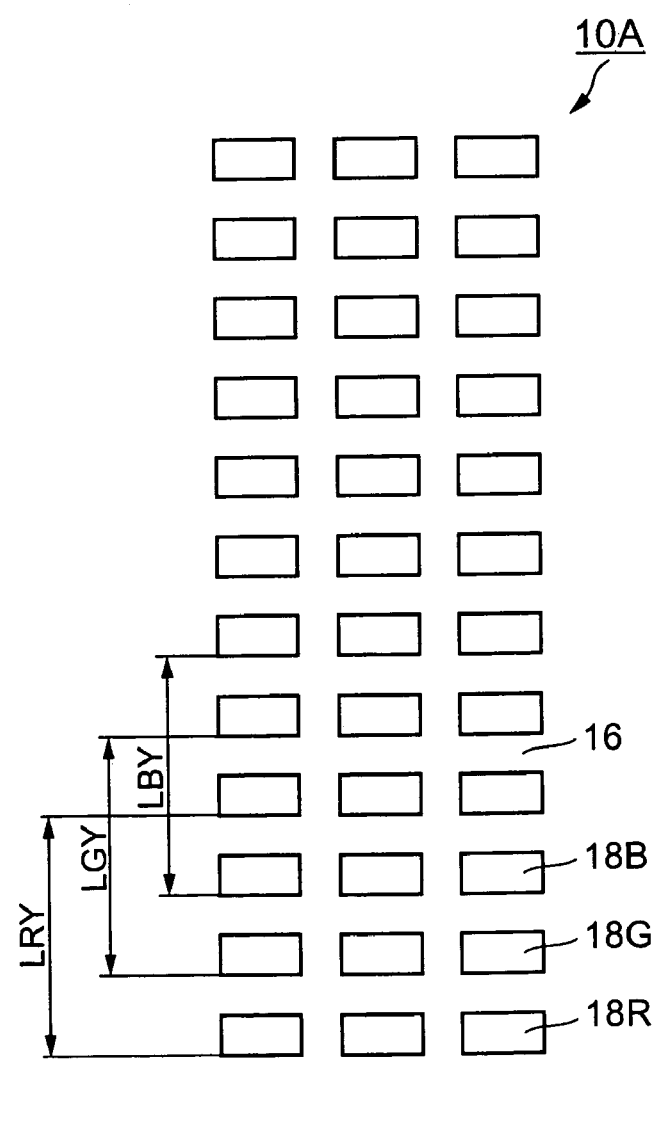
Figure 10:
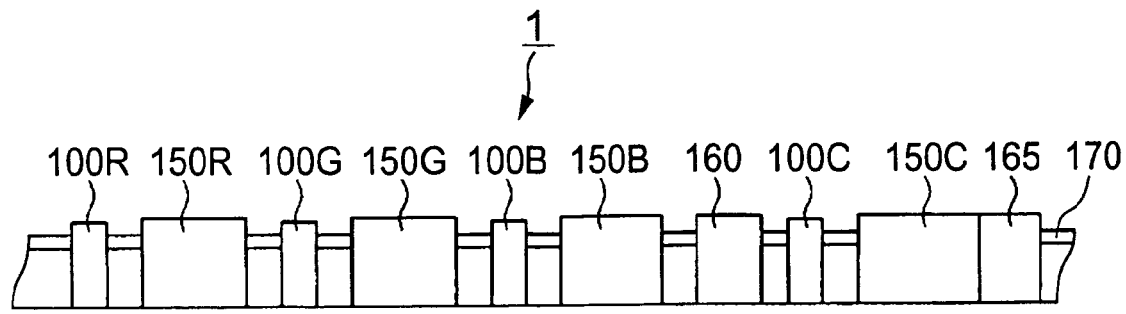
FIG. 10 is a schematic view showing a manufacturing system of the second embodiment.

The manufacturing system 1 shown in FIG. 10 is a system that ejects corresponding color filter materials to the respective ejected portions 18R, 18G, and 18B on the base body 10A of FIG. 9. To be more specific, the manufacturing system 1 includes: an ejecting apparatus 100R to apply a color filter material 111R to all the ejected portions 18R; a drying apparatus 150R to dry the color filter material 111R on the ejected portions 18R; a 100G to apply a color filter material 111G to all the ejected portions 18G; a drying apparatus 150G to dry the color filter material 11G on the ejected portions 18G; a 100B to apply a color filter material 111B to all the ejected portions 18B; a drying apparatus 150B to dry the color filter material 111B on the ejected portions 18B; an oven 160 to post-bake the color filter materials 111R, 111G, and 111B; an ejecting apparatus 100C to provide a protection film 20 on layers of the post-baked color filter materials 111R, 111G, and 111B; a drying apparatus 150C to dry the protection film 20; and a curing apparatus 165 to post-bake the dried protection film 20 to be cured. Further, the manufacturing system 1 includes a transportation apparatus 170 to transport the base body 10A in order of the ejecting apparatus 100R, the drying apparatus 150R, the ejecting apparatus 100G, the drying apparatus 150G, the ejecting apparatus 100B, the drying apparatus 150B, the ejecting apparatus 100C, the drying apparatus 150C, and the curing apparatus 165.

Figure 11:
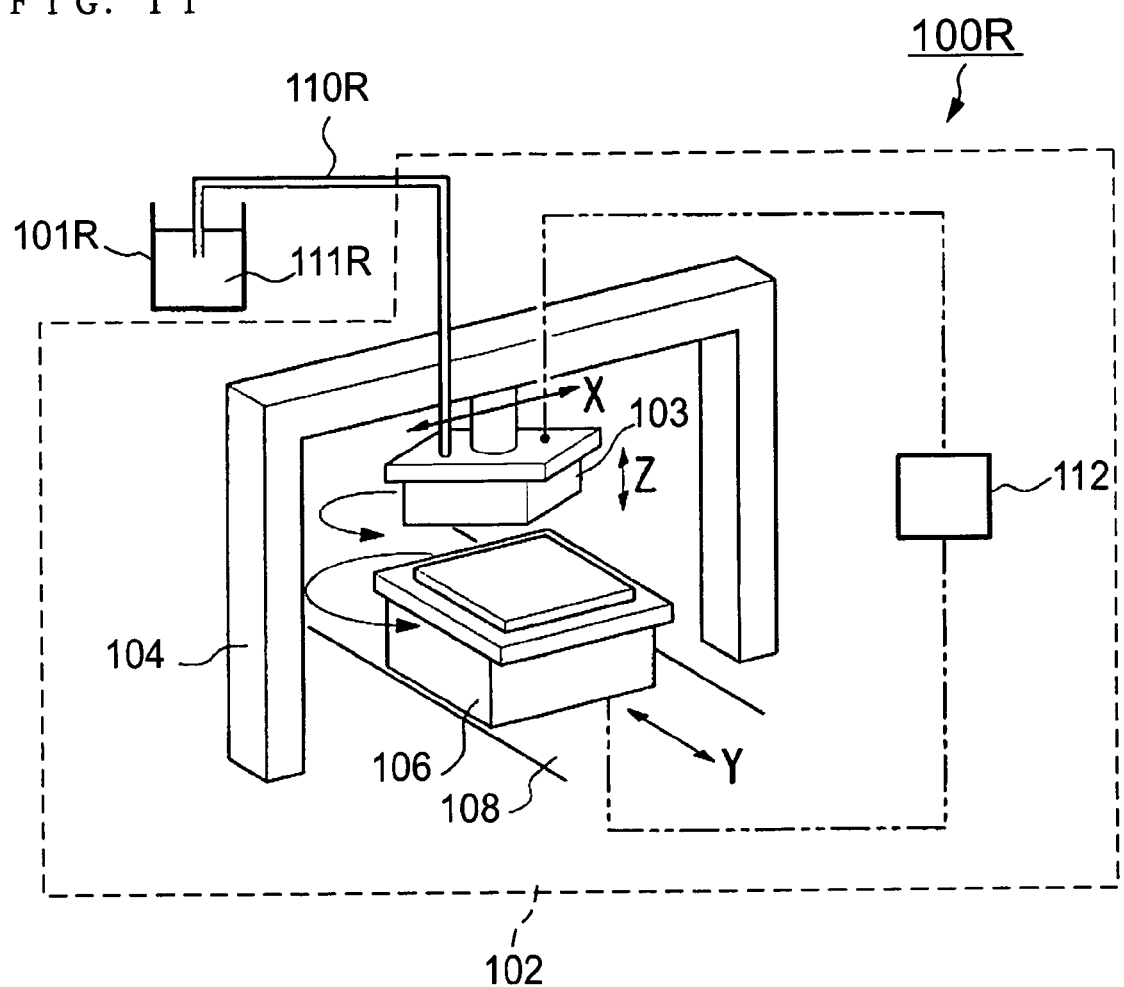
FIG. 11 is a schematic view showing an ejecting apparatus of the second embodiment.

As shown in FIG. 11, the configuration of the ejecting apparatus 100R is basically the same as the configuration of the ejecting apparatus 100 of the first embodiment. It should be noted, however, that the configuration of the ejecting apparatus 100R differs from the configuration of the ejecting apparatus 100 in that the ejecting apparatus 100R includes a tank 101R and a tube 110R for the liquid color filter material 111R instead of the tank 101 and the tube 110. Of the components of the ejecting apparatus 100R, the same components as those of the ejecting apparatus 100 are labeled with the same reference numerals as those in the first embodiment, and a description is not repeated.

The configuration of the ejecting apparatus 100G, the configuration of the ejecting apparatus 100B, and the configuration of the ejecting apparatus 100C are all basically the same as the configuration of the ejecting apparatus 100R. However, the configuration of the ejecting apparatus 100G differs from the configuration of the ejecting apparatus 100R in that the ejecting apparatus 100G includes a tank and a tube for the liquid color filter material 11G instead of the tank 101R and the tube 110R in the ejecting apparatus 100R. Likewise, the configuration of the ejecting apparatus 100B differs from the configuration of the ejecting apparatus 100R in that the ejecting apparatus 100B includes a tank and a tube for the liquid color filter material 111B instead of the tank 101R and the tube 110R. Further, the configuration of the ejecting apparatus 100C differs from the configuration of the ejecting apparatus 100R in that the ejecting apparatus 100C includes a tank and a tube for the protection film material instead of the tank 101R and the tube 110R. The liquid color filter materials 111R, 111G, and 111B in this embodiment are one example of a liquid material available in the invention.

Operations of the ejecting apparatus 100R will now be described. The ejecting apparatus 100R ejects the same material to a plurality of ejected portions 18R, which are placed in a matrix fashion on the base body 10A. Although it will be described in third through fifth embodiments below, the base body 10A may be replaced with a substrate for an electroluminescence display apparatus, a backside substrate for a plasma display apparatus, or a substrate in an image display apparatus equipped with electron emitting elements.

Figure 12:
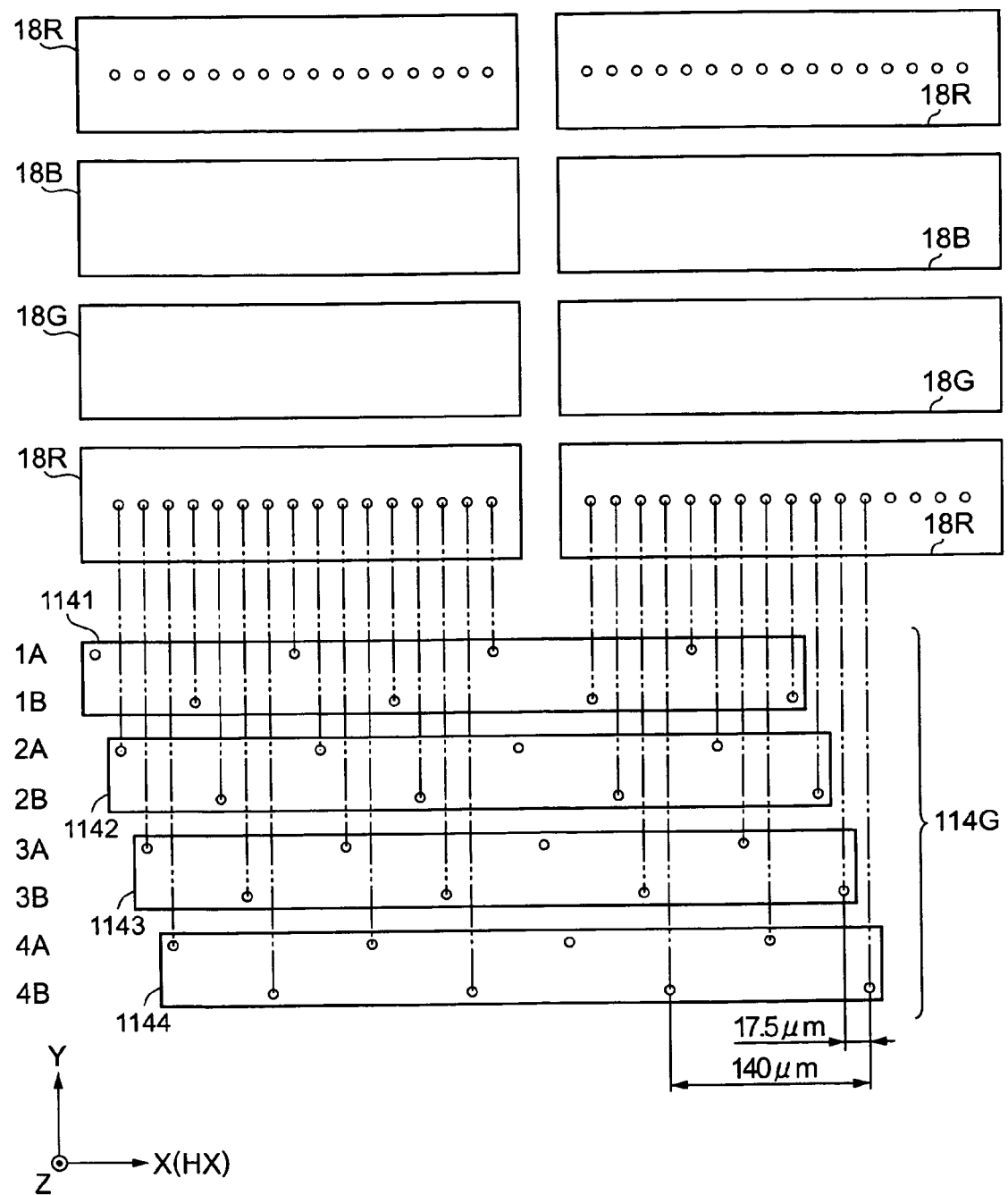
FIG. 12 is a schematic view showing an ejecting method of the second embodiment.

The base body 10A of FIG. 12 is held on the stage 106 in such a manner that the long side direction and the short side direction of the ejected portions 18R agree with the X-axis direction and the Y-axis direction, respectively.

Before a first scanning period starts, the control portion 112 first moves the carriage 103, that is, the head groups 114G, in the X-axis direction relatively with respect to the base body 10A according to the ejection data, so that the X-coordinates of some nozzles 118 fall within an X-coordinate range of the ejected portion 18R. The X-coordinate range of the ejected portion 18R means a range that is determined by the X-coordinates at both ends of the ejected portion 18R. In this embodiment, the length of the long sides of the ejected portion 18R is about 300 µm, and the nozzle pitch HXP in the X-axis direction of the head group 114G is 17.5 µm. Hence, 16 or 17 nozzles 118 in the head group 114G fall within the X-coordinate range of one ejected portion 18R. The color filter material 111R is ejected from none of the nozzles 118 in the outside of the X-coordinate range during a scanning period.

Incidentally, the term "scanning period" referred to in this embodiment means, as shown in FIG. 30, a period for one side of the carriage 103 to move once relatively from one end E1 (or the other end E2) to the other end E2 (or one end E1) of a scanning range 134 along the Y-axis direction. The term "scanning range 134" means a range within which the carriage 103 moves relatively in applying a material to all the ejected portions 18R on the base body 10A, and all the ejected portions 18R are covered within the scanning range 134. In some cases, the term "scanning range" may mean a range within which one nozzle 118 moves relatively, a range within which one nozzle array 116 moves relatively, or a range within which one head 114 moves relatively.

When the first scanning period starts, a head group 114G starts to move relatively to the positive direction (from bottom to top on the sheet surface of FIG. 12) in the Y-axis direction from one end E1 of the scanning range 134. The nozzle arrays 1A, 1B, 2A, 2B, 3A, 3B, 4A, and 4B then enter the regions corresponding to the ejected portions 18R in this order. The X-coordinate of the head group 114G do not vary during the first scanning period.

The control portion 112 determines a relative movement velocity of the carriage 103 in such a manner that one nozzle 118 overlaps the ejected portions 18R aligned in the Y-axis direction at each time interval equivalent to an integer multiple of the ejection period EP (FIG. 7($b$)). Because, when configured in this manner, other nozzles 118 in the nozzle array including that particular nozzle 118 overlap their respective ejected portions 18R at each time interval equal to an integer multiple of the ejection period EP.

Figure 13:
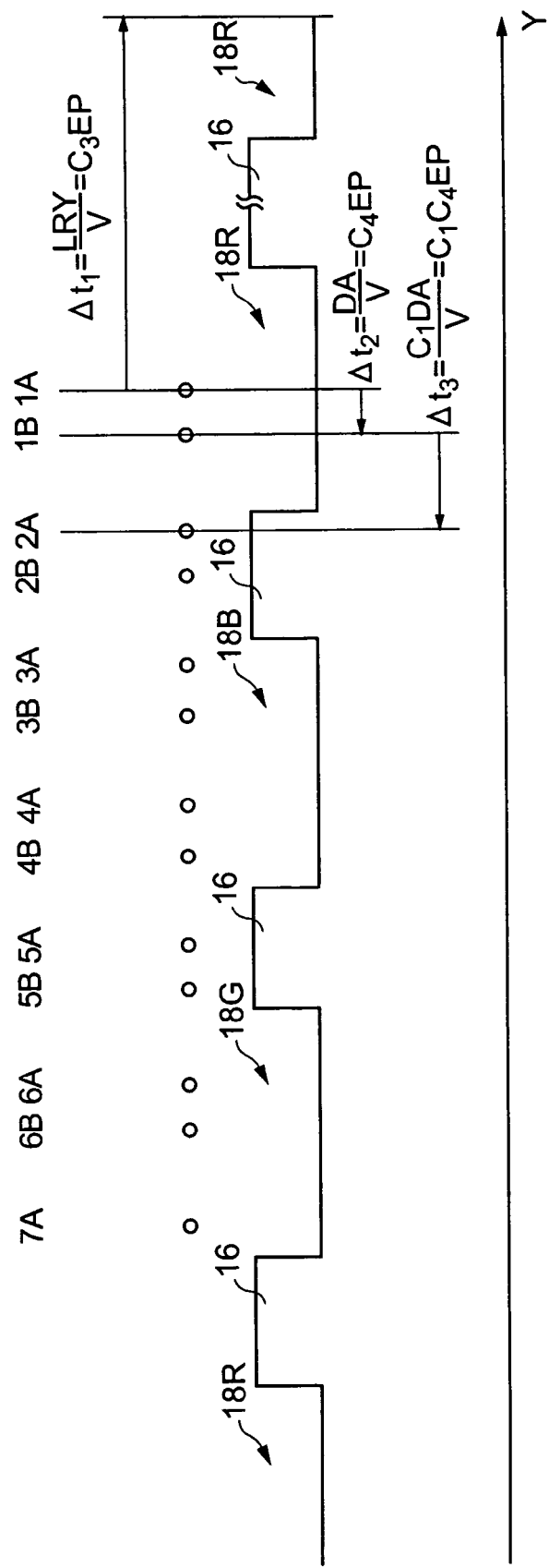
FIG. 13 is a schematic view showing the ejecting method of the second embodiment.

In this embodiment, the relative movement velocity V of the carriage 103 with respect to the stage 106 is set to satisfy:

$$V = LYR/(c_3 \cdot EP) \qquad \text{(Equation 3)}$$

where LYR is a pitch of the ejected portions 18R along the Y-axis direction, EP is the ejection period, and $c_3$ is an integer. Because the relative movement velocity V satisfies Equation 3 above, as shown in FIG. 13, the nozzle array 1A overlaps a plurality of ejected portions 18R aligned in the Y-axis direction at a time interval $\Delta t_1$ equal to an integer multiple ($c_3$ times) of the ejection period EP.

Further, in this embodiment, the first distance between nozzle arrays, DA, is set as follows on the basis of the relative movement velocity V found from Equation 3 above:

$$DA = c_4 \cdot EP \cdot V \qquad \text{(Equation 4)}$$

Because the first distance between nozzle arrays, DA, satisfies Equation 4 above, the nozzle array 1B overlaps the ejected portions 18R at a time interval $\Delta t_2$, equal to an integer multiple ($c_4$ times) of the ejection period EP, from the time point at which the nozzle array 1A overlaps the ejected portions 18R.

Further, in this embodiment, as with the first embodiment, because the second distance between nozzle arrays, DB, is substantially equal to an integer multiple ($c_1$ times) of the first distance between nozzle arrays, DA, it can be expressed as:

$$DB = c_1 \cdot DA \qquad \text{(Equation 5)}$$

Hence, the nozzle array 2A overlaps the ejected portions 18R after a time interval $\Delta t_3$, equal to an integer multiple ($c_1 \cdot c_4$ times) of the ejection period EP, from the time point at which the nozzle array 1B overlaps the ejected portions 18R.

In the case shown in FIG. 12, when the nozzle array 1A enters a region corresponding to a given ejected portion 18R, the color filter material 111 is ejected from the second nozzle 118 from the left and the third nozzle 118 from the left in the nozzle array 1A. The nozzle array 1B then enters the region corresponding to that particular ejected portion 18R after a time period, equal to an integer multiple ($c_4$ times) of the ejection period EP, from the time point at which the nozzle array 1A overlaps that particular ejected portion 18R. The color filter material 111R is then ejected from the nozzle 118 on the left edge and the second nozzle from the left in the nozzle array 1B.

The nozzle array 2A enters the region corresponding to that particular ejected portion 18R after a time period, equal to an integer multiple ($c_1 \cdot c_4$ times) of the ejection period EP, from the time point at which the nozzle array 1B overlaps that particular ejected portion 18R. The color filter material 111R is then ejected from the nozzle 118 on the left edge and the second nozzle 118 from the left in the nozzle array 2A. The nozzle array 2B then enters the region corresponding to that particular ejected portion 18R after a time period, equal to an integer multiple ($c_4$ times) of the ejection period EP, from the time point at which the nozzle array 2A overlaps the ejected portion 18R. The color filter material 111R is then ejected from the nozzle 118 on the left edge and the second nozzle 118 from the left in the nozzle array 2B.

The nozzle array 3A enters the region corresponding to that particular ejected portion 18R after a time period, equal to an integer multiple ($c_1 \cdot c_4$ times) of the ejection period EP, from the time point at which the nozzle array 2B overlaps that particular ejected portion 18R. The color filter material 111R is then ejected from the nozzle 118 on the left edge and the second nozzle 118 from the left in the nozzle array 3A. The nozzle array 3B then enters the region corresponding to that particular ejected portion 18R after a time period, equal to an integer multiple ($c_4$ times) of the ejection period EP, from the time point at which the nozzle array 3A overlaps the ejected portion 18R. The color filter material 111R is then ejected from the nozzle 118 on the left edge and the second nozzle 118 from the left in the nozzle array 3B.

The nozzle array 4A enters the region corresponding to that particular ejected portion 18R after a time period, equal to an integer multiple ($c_1 \cdot c_4$ times) of the ejection period EP, from the time point at which the nozzle array 3B overlaps that particular ejected portion 18R. The color filter material 111R is then ejected from the nozzle 118 on the left edge and the second nozzle 118 from the left in the nozzle array 4A. The nozzle array 4B then enters the region corresponding to that particular ejected portion 18R after a time period, equal to an integer multiple ($c_4$ times) of the ejection period EP, from the time point at which the nozzle array 4A overlaps that particular ejected portion 18R. The color filter material 111R is then ejected from the nozzle 118 on the left edge and the second nozzle 118 from the left in the nozzle array 4B.

In this manner, all the nozzle arrays in the head group 114G overlap a plurality of the ejected portions 18R aligned in the Y-axis direction in the same phase in relative to the ejection period EP. It is thus possible to use the driving signal generating portion 203 commonly to the nozzles 118 in all the nozzle arrays. Hence, the circuit configuration can be made simple while maintaining the accuracy of the ejection waveform (driving waveform).

Further, according to this embodiment, it is possible to eject the color filter material 111R in a volume needed for a single ejected portion 18R within one scanning period. This is because the nozzle pitch GXP in the X-axis direction of the head group 114G is substantially equal to ¼ of the nozzle pitch HXP in the X-axis direction of one head 114, which in turn allows more nozzles 118 to overlap a single ejected portion during one scanning period.

On the other hand, as shown in FIG. 12, during the first scanning period, the nozzle 118 on the left edge in the nozzle array 1A, the second nozzle 118 from the right in the nozzle array 2A, the second nozzle 118 from the right in the nozzle array 3A, and the second nozzle 118 from the right in the nozzle array 4A never overlap the ejected potion 18R. Hence, the color filter material 111R is ejected from none of these nozzles.

When the first scanning period ends, the control portion 112 moves the head group 114G relatively in the X-axis direction, and then starts the next scanning period for the color filter material 111R to be ejected to the ejected portions 18R for which application has not been finished yet.

The above description described a step of applying the color filter material 111R to the ejected portions 18R. In the following, a series of steps until the color filter substrate 10 is obtained by the manufacturing system 1 will be described.

The base body 10A of FIG. 9 will be made first according the procedure as follows. Initially, a metal thin film is deposited on the supporting substrate 12 by means of sputtering or evaporation. The grid-like black matrix 14 is then made out of this metal thin film in the photolithography step. Examples of materials of the black matrix 14 include chromium metal and chromium oxides. The supporting substrate 12 is a light-transmitting substrate with respect to visible light, and comprises, for example, a glass substrate. Subsequently, a resist layer made of negative-type photosensitive resin components is applied to cover the supporting substrate 12 and the black matrix 14. The resist layer is exposed while a mask film made into a shape of a matrix pattern is closely adhered onto the resist layer. The bank 16 is obtained by removing unexposed portion of the resist layer later through etching. The base body 10A is obtained by the steps described above.

The bank 16 may be replaced with a bank made of resin black. In this case, the metal thin film (black matrix 14) is omitted, and the bank layer comprises a single layer.

Subsequently, the base body 10A is made lyophilic through the oxygen plasma treatment under ambient pressure. Through this treatment, the surface of the supporting substrate 12, the surface of the black matrix 14, and the surface of the bank 16 in the respective concave portions (part of pixel regions) defined by the supporting substrate 12, the black matrix 14, and the bank 16 come to express lyophilic properties. Further, the base body 10A is subjected to the plasma treatment using methane tetra-fluoride as a treatment gas. Through the plasma treatment using methane tetra-fluoride, the surface of the bank 16 in the respective concave portions is subjected to fluoridization (treated to be liquid repellent), which renders the surface of the bank 16 liquid repellent.

Although the surface of the supporting substrate 12 and the surface of the black matrix 14, which have been made lyophilic, slightly lose the lyophilic properties due to the plasma treatment using methane tetra-fluoride, these surfaces still remain lyophilic. By applying predetermined surface treatments to the surface of the concave portions defined by the supporting substrate 12, the black matrix 14, and the bank 16 in this manner, the surface of the concave portions is made into ejected portions 18R, 18G, and 18B.

A surface having desired lyophilic properties and liquid repellency may be obtained without performing the surface treatments as described above depending on the quality of material of the supporting substrate 12, the quality of material of the black matrix 14, and the quality of material of the bank 16. In such a case, the surface of the concave portions defined by the supporting substrate 12, the black matrix 14, and the bank 16 is obtained as the ejected portions 18R, 18G, and 18B without applying the surface treatments.

The base body 10A, on which the ejected portions 18R, 18G, and 18B are formed, is transported to the stage 106 of the ejecting apparatus 100R by the transportation apparatus 170, and placed on the stage 106. Then, as shown in FIG. 14(a), the ejecting apparatus 100R ejects the color filter material 111R from the heads 114 so that a layer of the color filter material 111R is formed on all the ejected portions 18R. To be particular, the ejecting apparatus 100R applies the color filter material 111R to the ejected portions 18R by the ejecting method described with reference to FIG. 12. When the layer of the color filter material 111R is formed on all the ejected portions 18R on the base body 10A, the transportation apparatus 170 positions the base body 10A inside the drying apparatus 150R. The filter layer 111FR is obtained on the ejected portions 18R by completely drying the color filter material 111R on the ejected portions 18R.

The transportation apparatus 170 then positions the base body 10A on the stage 106 of the ejecting apparatus 100G. Then, as shown in FIG. 14(b), the ejecting apparatus 100G ejects the color filter material 111G from the heads 114 so that a layer of the color filter material 111G is formed on all the ejected portions 18G. To be particular, the ejecting apparatus 100G applies the color filter material 111G to the ejected portions 18G by the ejecting method described with reference to FIG. 12. When the layer of the color filter material 111G is formed on all the ejected portions 18G on the base body 10A, the transportation apparatus 170 positions the base body 10A inside the drying apparatus 150G. The filter layer 111FG is obtained on the ejected portions 18G by completely drying the color filter material 111G on the ejected portions 18G.

The transportation apparatus 170 then positions the base body 10A on the stage 106 of the ejecting apparatus 100B. Then, as shown in FIG. 14(c), the ejecting apparatus 100B ejects the color filter material 111B from the heads 114 so that a layer of the color filter material 111B is formed on all the ejected portions 18B. To be particular, the ejecting apparatus 100B applies the color filter material 111B to the ejected portions 18B by the ejecting method described with reference to FIG. 12. When the layer of the color filter material 111B is formed on all the ejected portions 18B on the base body 10A, the transportation apparatus 170 positions the base body 10A inside the drying apparatus 150B. The filter layer 111FB is obtained on the ejected portions 18B by completely drying the color filter material 111B on the ejected portions 18B.

The transportation apparatus 170 then positions the base body 10A inside the oven 160. The oven 160 then post-bakes the filter layers 111FR, 111FG, and 111FB.

The transportation apparatus 170 then positions the base body 10A on the stage 106 of the ejecting apparatus 100C.

The ejecting apparatus 100C then ejects a liquid protection film material so that the protection film 20 is formed to cover the filter layers 111FR, 111FG, and 111FB and the bank 16. After the protection film 20 covering the filter layers 111FR, 111FG, and 111FB and the bank 16 is formed, the transportation apparatus 170 positions the base body 10A inside the oven 150C. The base body 10A is made into the color filter substrate 10 by completely drying the protection film 20 in the oven 150C and then by completely curing the protection film 20 by heating in the curing apparatus 165.

According to this embodiment, in each piece of ejecting apparatus 100R, 100G, and 100B, the nozzle pitch in the X-axis direction of the head group 114G is 1/N the length of the nozzle pitch in the X-axis direction of the heads 114, where N is the number of heads 114 included in the head group 114G. Hence, the nozzle linear density in the X-axis direction of each piece of ejecting apparatus 100R, 100G, and 100B is higher than the nozzle linear density in the X-axis direction of a normal ink jet apparatus. The manufacturing system 1 is thus able to apply a color filter material to ejected portions of various sizes by simply changing the ejection data. Further, the manufacturing system 1 is able to manufacture a color filter substrate with various pitches by simply changing the ejection data.

Third Embodiment

An example when the invention is applied to a manufacturing system of an electroluminescence display apparatus will now be described.

A base body 30A shown in FIG. 15(a) and FIG. 15(b) is a substrate that will be made into an electroluminescence display apparatus 30 through treatments applied in a manufacturing system 2 (FIG. 16) described below. The base body 30A includes a plurality of ejected portions 38R, 38G, and 38B placed in a matrix fashion.

To be more specific, the base body 30A includes: a supporting substrate 32; a circuit element layer 34 formed on the supporting substrate 32; a plurality of pixel electrodes 36 formed on the circuit element layer 34; and a bank 40 formed in spaces among the plurality of pixel electrodes 36. The supporting substrate is a light-transmitting substrate with respect to visible light, and comprises, for example, a glass substrate. Each of the plurality of pixel electrodes 36 is a light-transmitting electrode with respect to visible light, and comprises, for example, an ITO (Indium-Tin Oxide) electrode. Also, the plurality of pixel electrodes 36 are placed on the circuit element layer 34 in a matrix fashion, and each defines the pixel region. The bank 40 is a grid shape and surrounds each of the plurality of pixel electrodes 36. The bank 40 comprises an inorganic bank 40A formed on the circuit element layer 34 and an organic bank 40B positioned on the inorganic bank 40A.

The circuit element layer 34 is a layer including: a plurality of scanning electrodes that extend in a predetermined direction on the supporting substrate 32; an insulation film 42 formed to cover the plurality of scanning electrodes; a plurality of signal electrodes that are positioned on the insulation film 42 and extend in a direction intersecting at right angles with the direction in which the plurality of scanning electrodes extend; a plurality of switching elements 44 positioned in the vicinity of the intersections of the scanning electrodes and the signal electrodes; and an inter-layer insulation film 45 made of polyimide or the like to cover the plurality of switching elements 44. The gate electrode 44G and the source electrode 44S in each switching element 44 are electrically connected to a corresponding scanning electrode and a corresponding signal electrode, respectively. On the inter-layer insulation film 45 are positioned the plurality of pixel electrodes 36. The inter-layer insulation film 45 is provided with through-holes 44V at portions corresponding to the drain electrodes 44D in the respective switching elements 44. The switching elements 44 and the corresponding pixel electrodes 36 are electrically connected to each other via these through-holes 44V. Also, the respective switching elements 44 are positioned at locations corresponding to the bank 40. That is to say, when observed from a direction perpendicular to the sheet surface of FIG. 14(*b*), each of the plurality of switching elements 44 is positioned to be covered with the bank 40.

The concave portions (part of the pixel regions) on the base body 30A, which are defined by the pixel electrodes 36 and the bank 40, correspond to ejected portions 38R, ejected portions 38G, and ejected portions 38B. The ejected portions 38R are regions where a luminous layer 211FR emitting a ray of light in a wavelength range for red should be formed. The ejected portions 38G are regions where a luminous layer 211FG emitting a ray of light in a wavelength range for green should be formed. The ejected portions 38B are regions where a luminous layer 211GB emitting a ray of light in a wavelength range for blue should be formed.

The base body 30A shown in FIG. 15(*b*) is positioned on a virtual plane parallel to both the X-axis direction and the Y-axis direction. The row direction and the column direction of a matrix comprising a plurality of ejected portions 38R, 38G, and 38B are parallel to the X-axis direction and the Y-axis direction, respectively. In the base body 30A, the ejected portions 38R, the ejected portions 38G, and the ejected portions 38B are aligned in the Y-axis direction periodically in this order. Meanwhile, the ejected portions 38R are aligned in a line at predetermined, regular intervals in the X-axis direction. Also, the ejected portions 38G are aligned in a line at predetermined, regular intervals in the X-axis direction, and the ejected portions 38B are aligned in a line at predetermined, regular intervals in the X-axis direction. The X-axis direction and the Y-axis direction intersect with each other at a right angle.

An interval LRY along the Y-axis direction, that is, a pitch, among the ejected portions 38R is about 560 μm. This interval is equal to an interval LGY along the Y-axis direction among the ejected portions 38G as well as an interval LBY along the Y-axis direction among the ejected portions 18B. The plane image of each ejected portion 38R is a rectangular shape determined by long sides and short sides. To be more specific, the length of the Y-axis direction of each ejected portion 38R is about 100 μm and the length in the X-axis direction is about 300 μm. The ejected portions 38G and the ejected portions 38B are the same as the ejected portions 38R in shape and size. The intervals among the ejected portions and the size of the ejected portions correspond to the intervals and the size of the pixel regions for the corresponding colors in about a 40-inch high-definition TV.

Figure 16:
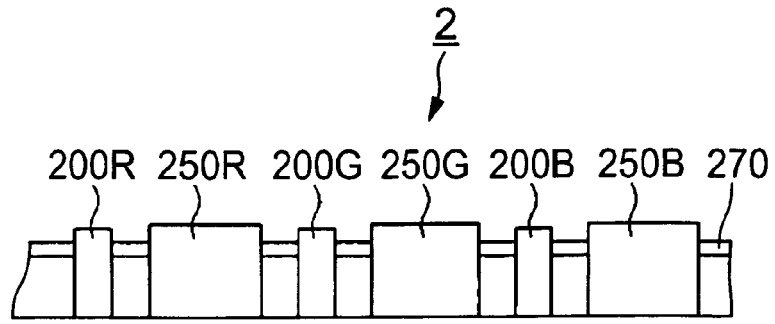
FIG. 16 is a schematic view showing a manufacturing system of the third embodiment.

The manufacturing system 2 shown in FIG. 16 is a system that ejects corresponding light-emitting materials to the respective ejected portions 38R, 38G, and 38B on the base body 30A of FIG. 15. To be more specific, the manufacturing system 2 includes: an ejecting apparatus 200R to apply a light-emitting material 211R to all the ejected portions 38R; a drying apparatus 250R to dry the light-emitting material 211R on the ejected portions 38R; an ejecting apparatus 200G to apply a light-emitting material 211G to all the ejected portions 38G; a drying apparatus 250G to dry the light emitting material 211G on the ejected portions 38G; an ejecting apparatus 200B to apply a light-emitting material 211B to all the ejected portions 38B; and a drying apparatus 250B to dry the light-emitting material B on the ejected portions 38B. Further, the manufacturing system 2 includes a transportation apparatus 270 to transport the base body 30A in order of the ejecting apparatus 200R, the drying apparatus 250R, the ejecting apparatus 200G, the drying apparatus 250G, the ejecting apparatus 200B, and the drying apparatus 250B.

Figure 17:
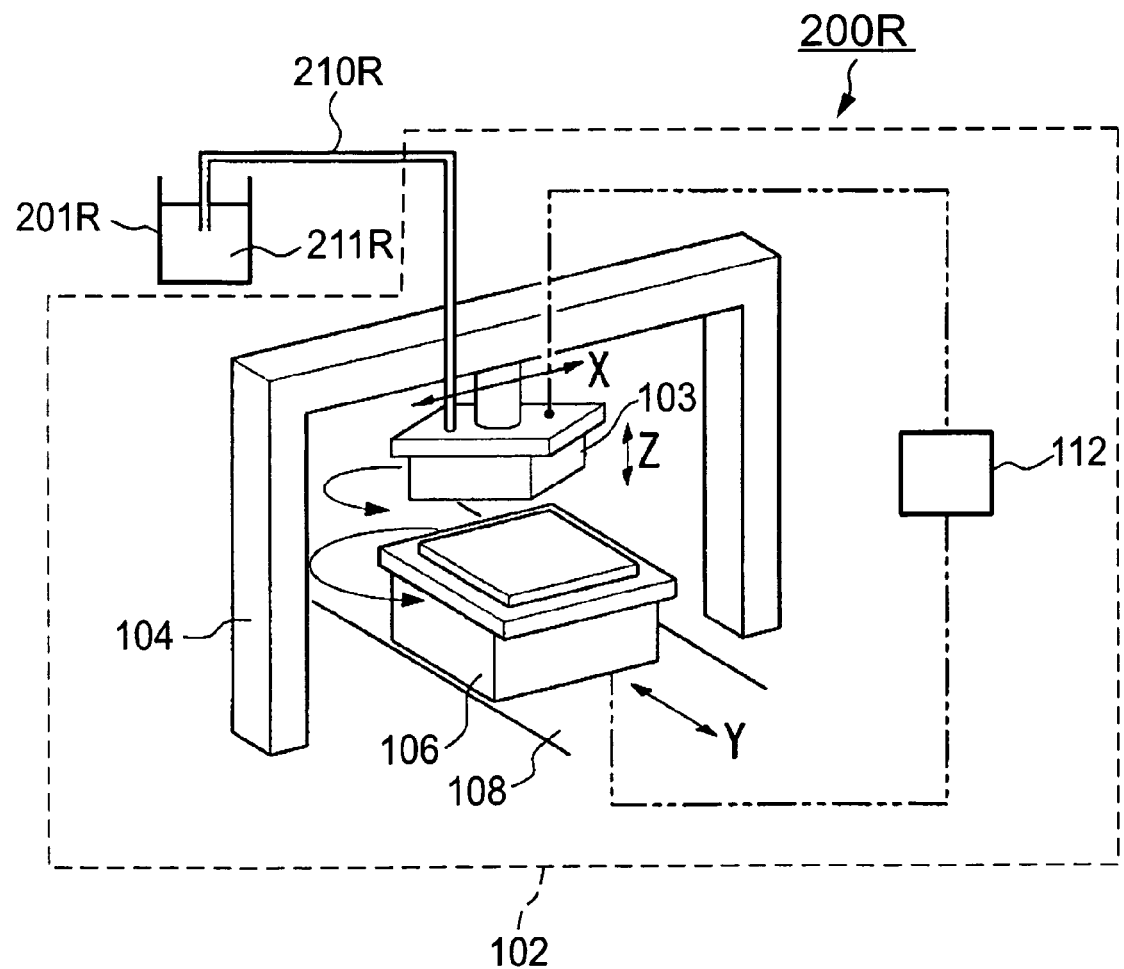
FIG. 17 is a schematic view showing an ejecting apparatus of the third embodiment.

The ejecting apparatus 200R shown in FIG. 17 includes a tank 201R to hold the liquid light-emitting material 211R, a tube 210R, and an ejection scanning portion 102 to which the light-emitting material 211R is supplied from the tank 201R via the tube 210R. The configuration of the ejection scanning portion 102 is the same as the configuration of the ejection scanning portion 102 (FIG. 1) of the first embodiment. Hence, like components are labeled with like reference numerals and a description is not repeated. The configuration of the ejecting apparatus 200G and the configuration of the ejecting apparatus 200B are both basically the same as the configuration of the ejecting apparatus 200R. It should be noted, however, that the configuration of the ejecting apparatus 200G differs from the configuration of the ejecting apparatus 200R in that the ejecting apparatus 200G includes a tank and a tube for the light-emitting material 211G instead of the tank 201R and the tube 210R. Likewise, the configuration of the ejecting apparatus 200B differs from the configuration of the ejecting apparatus 200R in that the ejecting apparatus 200B includes a tank and a tube for the light-emitting material 211B instead of the tank 201R and the tube 210R. The light-emitting materials 211R, 211B, and 211G in this embodiment are one example of a liquid material available in the invention.

A manufacturing method of an electroluminescence display apparatus 30 using the manufacturing system 2 will now be described. The base body 30A shown in FIG. 15 is manufactured first with the use of known film-deposition technique and patterning technique.

Subsequently, the base body 30A is made lyophilic through the oxygen plasma treatment under ambient pressure. Through this treatment, the surface of the pixel electrodes 36, the surface of the inorganic bank 40A, and the surface of the organic bank 40B in respective concave portions (part of pixel regions) defined by the pixel electrodes 36 and the bank 40 come to express lyophilic properties. Further, the base body 30A is subjected to the plasma treatment using methane tetra-fluoride as a treatment gas. Through the plasma treatment using methane tetra-fluoride, the surface of the organic bank 40B in the respective concave portions is subjected to fluoridization (treated to be liquid repellent), which renders the surface of the organic bank 40B liquid repellent. Although the surface of the pixel electrodes 36 and the surface of the inorganic bank 40A, which have been made lyophilic, slightly lose the lyophilic properties due to the plasma treatment using methane tetra-fluoride, these surfaces still remain lyophilic. By applying predetermined surface treatments to the surface of the concave portions defined by the pixel electrodes 36 and the bank 40 in this manner, the surface of the concave portions is made into ejected portions 38R, 38G, and 38B.

A surface having desired lyophilic properties and liquid repellency may be obtained without performing the surface treatments as described above depending on the quality of material of the pixel electrodes 36, the quality of material of the inorganic bank 40, and the quality of material of the organic bank 40. In such a case, the surface of the concave portions defined by the pixel electrodes 36 and the bank 40 is obtained as the ejected portions 38R, 38G, and 38B without applying the surface treatments.

Hole transport layers 37R, 37G, and 37B may be formed correspondingly on each of the plurality of pixel electrodes 36 to which the surface treatments have been applied. When the hole transport layers 37R, 37G, and 37B are present between the pixel electrodes 36 and the luminous layers 211RF, 211GF, and 211BF described below, luminous efficiency of the electroluminescence display apparatus is increased. In a case where the hole transport layer is provided on each of a plurality of pixel electrodes 36, the concave portions defined by the hole transport layer and the bank 40 correspond to ejected portions 38R, 38G, and 38B.

It is possible to form the hole transport layers 37R, 37G, and 37B by an ink jet method. In this case, the hole transport layers can be formed by applying a predetermined quantity of a solution including materials that form the hole transport layers 37R, 37G, and 37B onto each pixel region followed by drying.

The base body 30A, on which the ejected portions 38R, 38G, and 38B are formed, is transported to the stage 106 of the ejecting apparatus 200R by the transportation apparatus 270, and placed on the stage 106. Then, as shown in FIG. 18(a), the ejecting apparatus 200R ejects the light-emitting material 211R from the heads 114 so that a layer of the light-emitting material 211R is formed on all the ejected portions 38R. To be particular, the ejecting apparatus 200R applies the light-emitting material 211R to the ejected portions 38R by the ejecting method described with reference to FIG. 12. When the layer of the light-emitting material 211R is formed on all the ejected portions 38R on the base body 30A, the transportation apparatus 270 positions the base body 30A inside the drying apparatus 250R. The luminous layer 211FR is obtained on the ejected portions 38R by completely drying the light-emitting material 211R on the ejected portions 38R.

The transportation apparatus 270 then positions the base body 30A on the stage 106 of the ejecting apparatus 200G. Then, as shown in FIG. 18(b), the ejecting apparatus 200G ejects the light-emitting material 211G from the heads 114 so that a layer of the light-emitting material 211G is formed on all the ejected portions 38G. To be particular, the ejecting apparatus 200G applies the light-emitting material 211G to the ejected portions 38G by the ejecting method described with reference to FIG. 12. When the layer of the light-emitting material 211G is formed on all the ejected portions 38G on the base body 30A, the transportation apparatus 270 positions the base body 30A inside the drying apparatus 250G. The luminous layer 211FG is obtained on the ejected portions 38G by completely drying the light-emitting material G on the ejected portions 38G.

The transportation apparatus 270 then positions the base body 30A on the stage 106 of the ejecting apparatus 200B. Then, as shown in FIG. 18(c), the ejecting apparatus 200B ejects the light-emitting material 211B from the heads 114 so that a layer of the light-emitting material 211B is formed on all the ejected portions 38B. To be particular, the ejecting apparatus 200B applies the light-emitting material 211B to the ejected portions 38B by the ejecting method described with reference to FIG. 12. When the layer of the light-emitting material 211B is formed on all the ejected portions 38B on the base body 30A, the transportation apparatus 270 positions the base body 30A inside the drying apparatus 250B. The luminous layer 211FB is obtained on the ejected portions 38B by completely drying the light-emitting material 211B on the ejected portions 38B.

Then, as shown in FIG. 18(d), a counter electrode 46 is provided to cover the luminous layers 211FR, 211FG, and 211FB and the bank 40. The counter electrode 46 functions as a cathode. The electroluminescence display apparatus 30 as shown in FIG. 18(d) is then obtained by bonding a sealing substrate 48 to the base body 30A at their peripheral portions. An inert gas 49 is sealed in a space between the sealing substrate 48 and the base body 30A.

In the electroluminescence display apparatus 30, light emanated from the luminous layers 211FR, 211FG, and 211FB is emitted via the pixel electrodes 36, the circuit element layer 34, and the supporting substrate 32. The electroluminescence display apparatus that emits light via the circuit element layer 34 as described above is referred to as a bottom emission type display apparatus.

According to this embodiment, in each piece of the ejecting apparatus 200R, 200G, and 200B, the nozzle pitch in the X-axis direction of the head group 114G is 1/N the length of the nozzle pitch in the X-axis direction of the heads 114, where N is the number of heads 114 included in the head group 114G. Hence, the nozzle linear density in the X-axis direction of each piece of the ejecting apparatus 200R, 200G, and 200B is higher than the nozzle linear density in the X-axis direction of a normal ink jet apparatus. The manufacturing system 2 is thus able to apply a light-emitting material to ejected portions of various sizes by simply changing the ejection data. Further, the manufacturing system 2 is able to manufacture an electroluminescence display apparatus with various pitches by simply changing the ejection data.

Fourth Embodiment

An example when the invention is applied to a manufacturing system of a backside (rear) substrate in a plasma display apparatus will now be described.

Figure 19A:
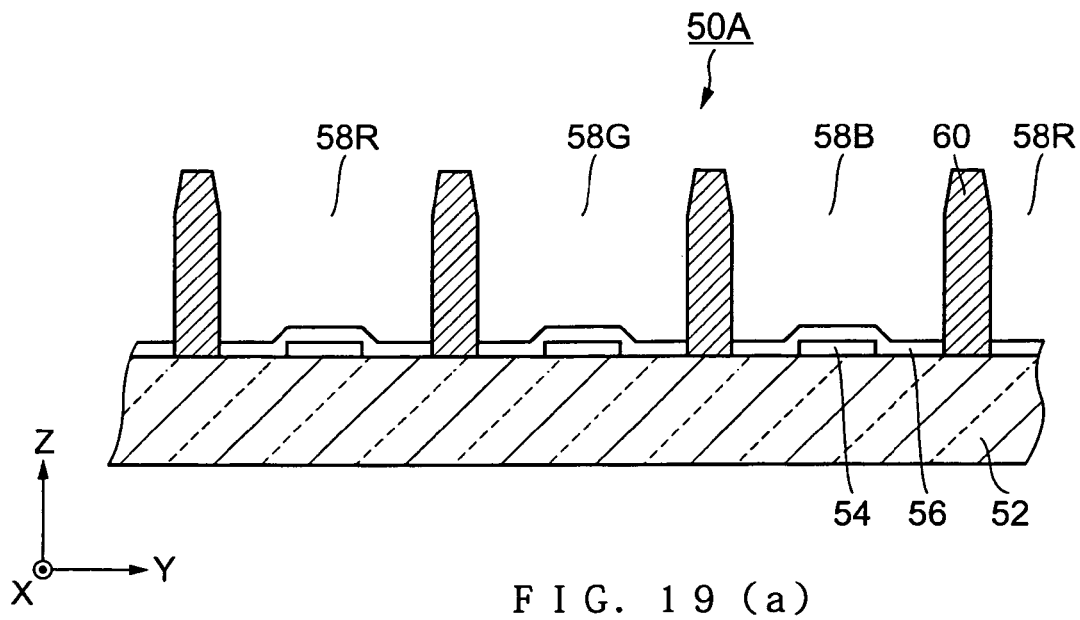
FIG. 19(a) and FIG. 19(b) are schematic views showing a base body of a fourth embodiment.
Figure 19B:
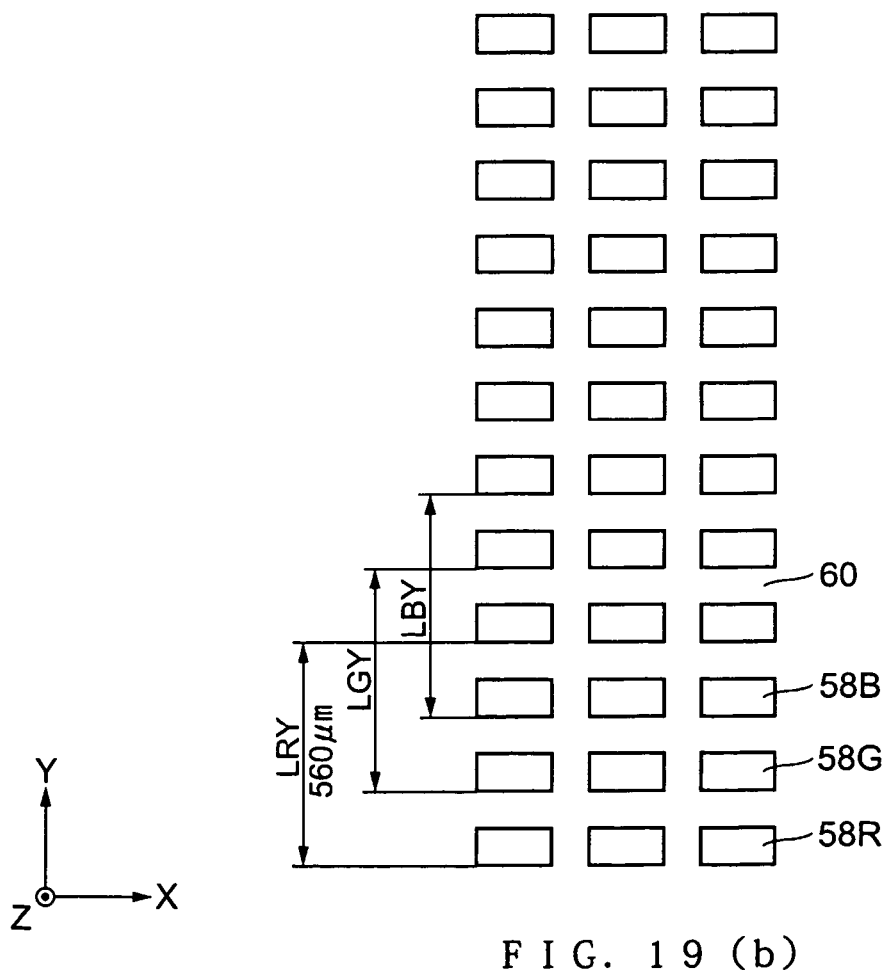

A base body 50A shown in FIG. 19(a) and FIG. 19(b) is a substrate that will be made into a backside substrate 50B in a plasma display apparatus through treatments applied in a manufacturing system 3 (FIG. 20) described below. The base body 50A includes a plurality of ejected portions 58R, 58G, and 58B placed in a matrix fashion.

To be more specific, the base body 50A includes: a supporting substrate 52, a plurality of address electrodes 54 formed on the supporting substrate 52 in the shape of stripes; a dielectric glass layer 56 formed to cover the address electrodes 54; and grid-like partition walls 60 that define a plurality of pixel regions. A plurality of pixel regions are positioned in a matrix fashion, and columns in the matrix comprising the plurality of pixel regions respectively correspond to the plurality of address electrodes 54. The base body 50A as described above is formed by a known screen printing technique.

In the respective pixel regions on the base body 50A, concave portions defined by the dielectric glass layer 56 and the partition walls 60 correspond to the ejected portions 58R, the ejected portions 58G, and the ejected portions 58B. The ejected portions 58R are regions where a fluorescent layer 311FR emitting a ray of light in a wavelength range for red should be formed. The ejected portions 58G are regions where a fluorescent layer 311FG emitting a ray of light in a wavelength range for green should be formed. The ejected portions 58B are regions where a fluorescent layer 311FB emitting a ray of light in a wavelength range for blue should be formed.

The base body 50A shown in FIG. 19(b) is positioned on a virtual plane parallel to both the X-axis direction and the Y-axis direction. The row direction and the column direction of the matrix comprising a plurality of ejected portions 58R, 58G, and 58B are parallel to the X-axis direction and the Y-axis direction, respectively. In the base body 50A, the ejected portion 58R, the ejected portion 58G, and the ejected portion 58B are aligned in the Y-axis direction periodically in this order. Meanwhile, the ejected portions 58R are aligned in a line at predetermined, regular intervals in the X-axis direction. Also, the ejected portions 58G are aligned in a line at predetermined, regular intervals in the X-axis direction, and the ejected portions 58B are aligned in a line at predetermined, regular intervals in the X-axis direction. The X-axis direction and the Y-axis direction intersect with each other at a right angle.

An interval LRY along the Y-axis direction, that is, a pitch, among the ejected portions 58R is about 560 μm. This interval is equal to an interval LGY along the Y-axis direction among the ejected portions 58G as well as an interval LBY along the Y-axis direction among the ejected portions 58B. The plane image of each ejected portion 58R is a rectangular shape determined by long sides and short sides. To be more specific, the length of the Y-axis direction of each ejected portion 58R is about 100 μm and the length in the X-axis direction is about 300 μm. The ejected portions 58G and the ejected portions 58B are the same as the ejected portions 58R in shape and size. The intervals among the ejected portions and the size of the ejected portions correspond to the intervals and the size of the pixel regions for the corresponding colors in about a 40-inch high-definition TV.

Figure 20:
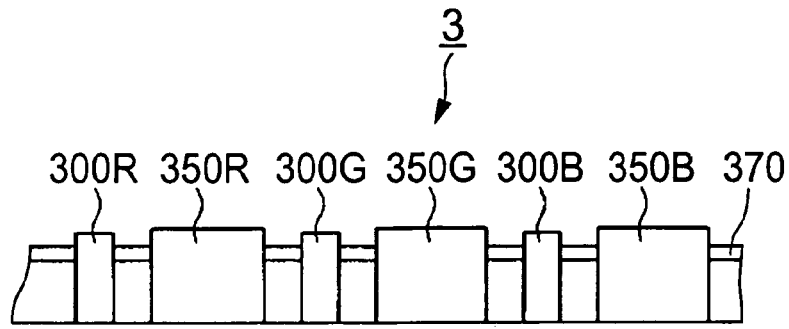
FIG. 20 is a schematic view showing a manufacturing system of the fourth embodiment.

The manufacturing system 3 shown in FIG. 20 is a system that ejects corresponding fluorescent materials to the respective ejected portions 58R, 58G, and 58B on the base body 50A of FIG. 19. The manufacturing system 3 includes: an ejecting apparatus 300R to apply a fluorescent material 311R to all the ejected portions 58R; a drying apparatus 350R to dry the fluorescent material 311R on the ejected portions 58R; an ejecting apparatus 300G to apply a fluorescent material 311G to all the ejected portions 58G; a drying apparatus 350G to dry the fluorescent material 311G on the ejected portions 58G; an ejecting apparatus 300B to apply a fluorescent material 311B to all the ejected portions 58B; and a drying apparatus 350B to dry the fluorescent material 311B on the ejected portions 58B. Further, the manufacturing system 3 includes a transportation apparatus 370 to transport the base body 50A in order of the ejecting apparatus 300R, the drying apparatus 350R, the ejecting apparatus 300G, the drying apparatus 350G, the ejecting apparatus 300B, and the drying apparatus 350B.

Figure 21:
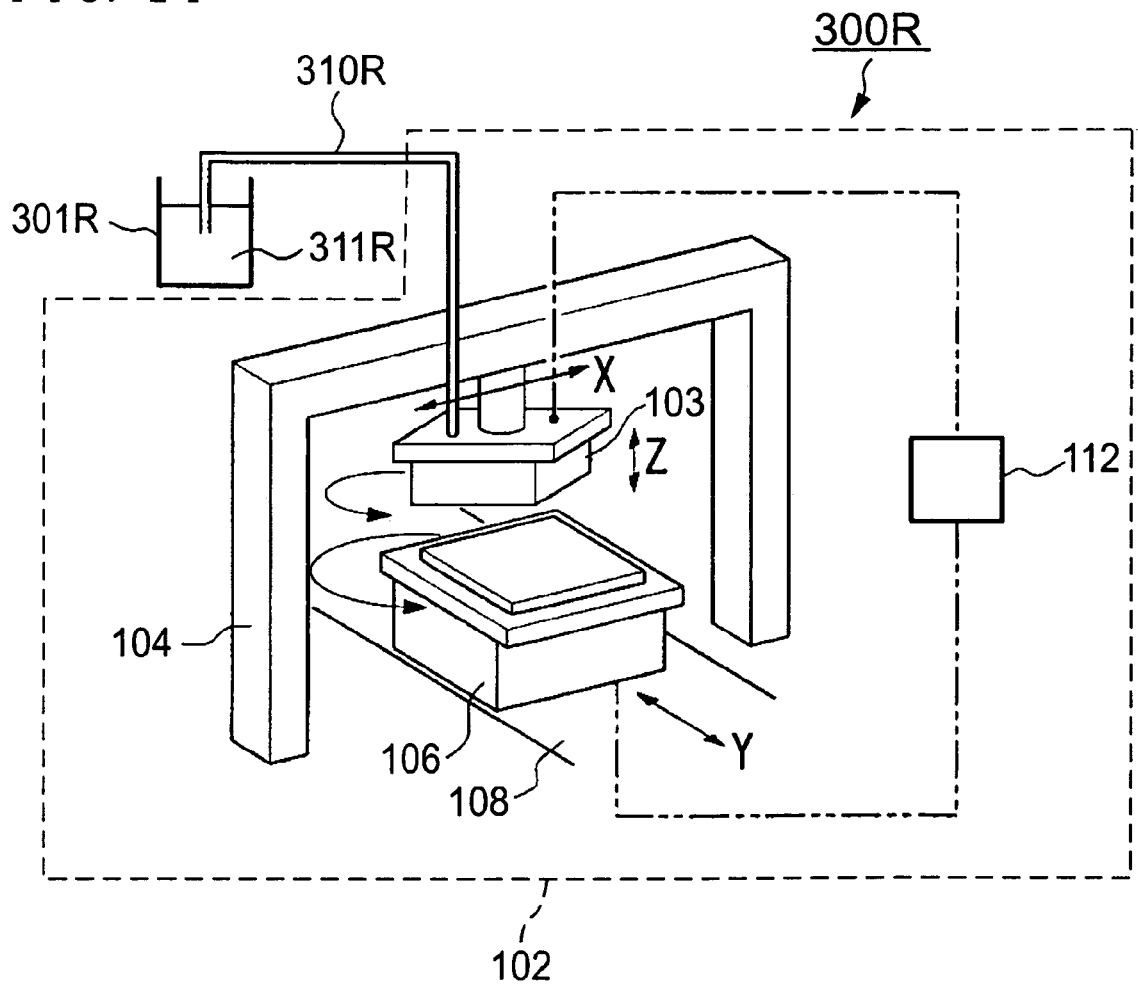
FIG. 21 is a schematic view showing an ejecting apparatus of the fourth embodiment.

The ejecting apparatus 300R shown in FIG. 21 includes a tank 301R to hold the liquid fluorescent material 311R, a tube 310R, and an ejection scanning portion 102 to which the color filter material is supplied from the tank 301R via the tube 310R. The configuration of the ejection scanning portion 102 has been described in the first embodiment, and a description is not repeated.

The configuration of the ejecting apparatus 300G and the configuration of the ejecting apparatus 300B are both basically the same as the configuration of the ejecting apparatus 300R. However, the configuration of the ejecting apparatus 300G differs from the configuration of the ejecting apparatus 300R in that the ejecting apparatus 300G includes a tank and a tube for the fluorescent material 311G instead of the tank 301R and the tube 310R. Likewise, the configuration of the ejecting apparatus 300B differs from the configuration of the ejecting apparatus 300R in that the ejecting apparatus 300B includes a tank and a tube for the fluorescent material 311B instead of the tank 301R and the tube 310R. The light fluorescent materials 311R, 311B, and 311G in this embodiment are one example of a liquid light-emitting material available in the invention.

A method of manufacturing a plasma display apparatus using the manufacturing system 3 will now be described. The base body 50A shown in FIG. 19 is obtained first by forming a plurality of address electrodes 54, the dielectric glass layer 56, and the partition walls 60 on the supporting substrate 52 through a known screen printing technique.

Subsequently, the base body 50A is made lyophilic through the oxygen plasma treatment under ambient pressure. Through this treatment, the surface of the partition walls 60 and the surface of the dielectric glass layer 56 in respective concave portions (part of pixel regions) defined by the partition walls 60 and the dielectric glass layer 56 come to express lyophilic properties, and these surfaces are made into ejected portions 58R, 58G, and 58B. A surface having desired lyophilic properties may be obtained without performing the surface treatment as described above depending on the quality of materials. In such a case, the surface of the concave portions defined by the partition walls 60 and the dielectric glass layer 56 is obtained as the ejected portions 58R, 58G, and 58B without applying the surface treatment.

Figure 22A:
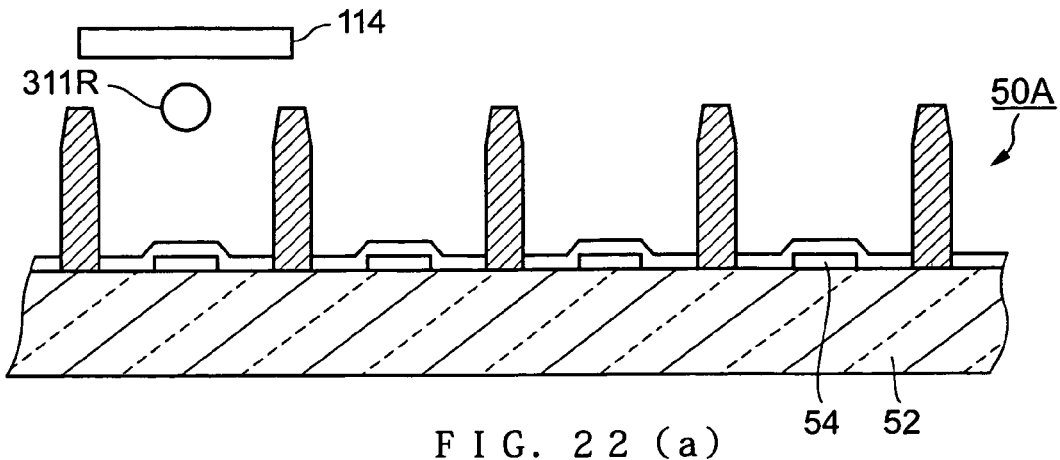
FIG. 22(a) through FIG. 22(c) are schematic views showing a manufacturing method of the fourth embodiment.

The base body 50A, on which the ejected portions 58R, 58G, and 58B are formed, is transported to the stage 106 of the ejecting apparatus 300R by the transportation apparatus 370, and placed on the stage 106. Then, as shown in FIG. 22(a), the ejecting apparatus 300R ejects the fluorescent material 311R from the heads 114 so that a layer of the fluorescent material 311R is formed on all the ejected portions 58R. To be particular, the ejecting apparatus 300R applies the fluorescent material 311R to the ejected portions 58R by the ejecting method described with reference to FIG. 12. When the layer of the fluorescent material 311R is formed on all the ejected portions 58R on the base body 50A, the transportation apparatus 370 positions the base body 50A inside the drying apparatus 350R. The fluorescent layer 311FR is obtained on the ejected portions 58R by completely drying the fluorescent material 311R on the ejected portions 58R.

Figure 22B:
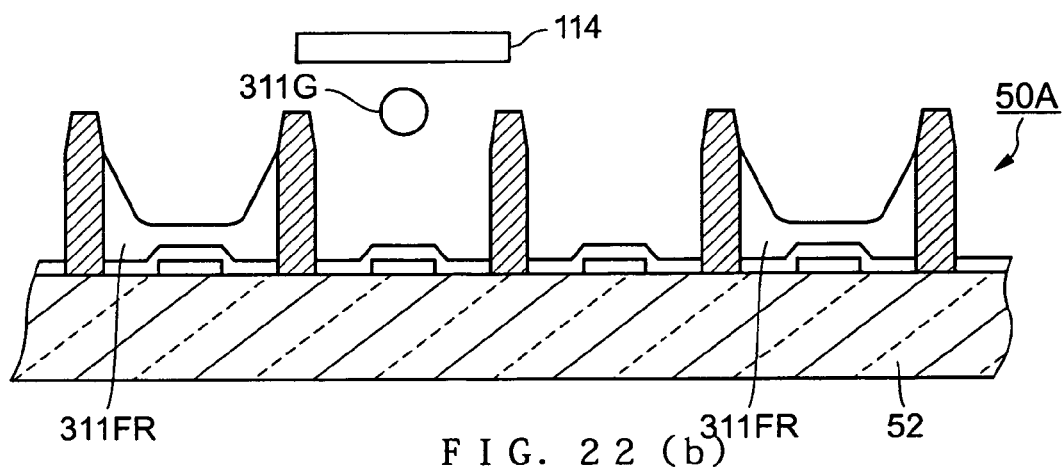

The transportation apparatus 370 then positions the base body 50A on the stage 106 of the ejecting apparatus 300G. Then, as shown in FIG. 22(b), the ejecting apparatus 300G ejects the fluorescent material 311G from the heads 114 so that a layer of the fluorescent material 311G is formed on all the ejected portions 58G. To be particular, the ejecting apparatus 300G applies the fluorescent material 311G to the ejected portions 58G by the ejecting method described with reference to FIG. 12. When the layer of the fluorescent material 311G is formed on all the ejected portions 58G on the base body 50A, the transportation apparatus 370 positions the base body 50A inside the drying apparatus 350G. The fluorescent layer 311FG is obtained on the ejected portions 58G by completely drying the fluorescent material 311G on the ejected portions 58G.

Figure 22C:
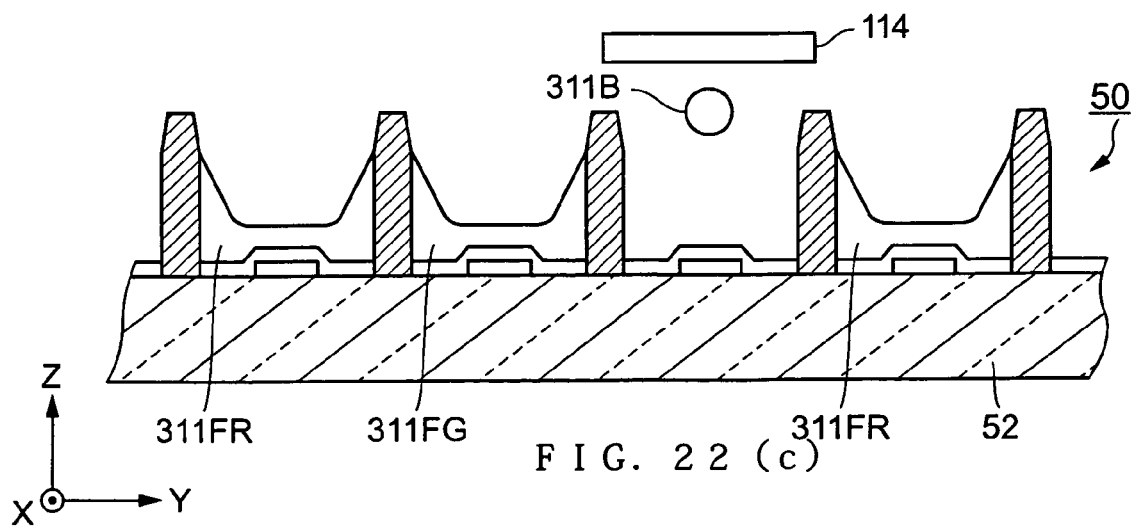

The transportation apparatus 370 then positions the base body 50A on the stage 106 of the ejecting apparatus 300B. Then, as shown in FIG. 22(c), the ejecting apparatus 300B ejects the fluorescent material 311B from the heads 114 so that a layer of the fluorescent material 311B is formed on all the ejected portions 58B. To be particular, the ejecting apparatus 300B applies the fluorescent material 311B to the ejected portions 58B by the ejecting method described with reference to FIG. 12. When the layer of the fluorescent material B is formed on all the ejected portions 58B on the base body 50A, the transportation apparatus 370 positions the base body 50A inside the drying apparatus 350B. The fluorescent layer 311FB is obtained on the ejected portions 58B by completely drying the fluorescent material 311B on the ejected portions 58B.

The base body 50A is made into the backside substrate 50B in the plasma display apparatus by the steps described above.

Figure 23:
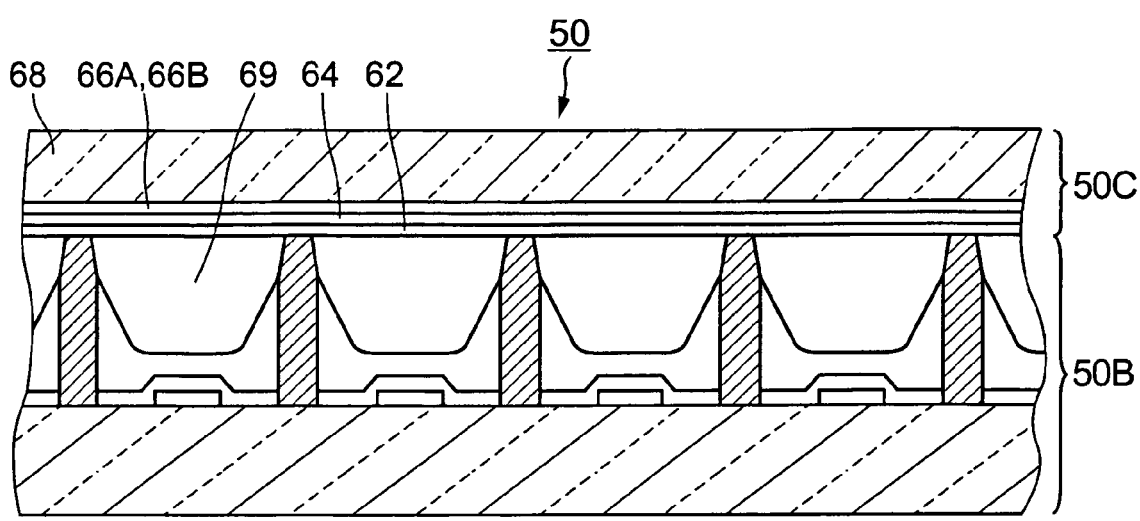
FIG. 23 is a schematic view showing the manufacturing method of the fourth embodiment.

Subsequently, the plasma display apparatus 50 is obtained by laminating the backside substrate 50B and a front substrate 50C as shown in FIG. 23 by a known method. The front substrate 50C includes: a glass substrate 68; display electrodes 66A and display scanning electrodes 66B patterned on the glass substrate 68 to be parallel to each other; a dielectric glass layer 64 formed to cover the display electrodes 66A and the display scanning electrodes 66B; and an MgO protection layer 62 formed on the dielectric glass layer 64. The backside substrate 50B and the front substrate 50C are positioned in such a manner that the address electrodes 54 on the backside substrate 50B and the display electrode 66A and the display scanning electrodes 66B on the front substrate 50C intersect with each other at a right angle. A discharge gas 69 is sealed in cells (pixel regions) surrounded by the respective partition walls 60, at a predetermined pressure.

According to this embodiment, in each piece of the ejecting apparatus 300R, 300G, and 300B, the nozzle pitch in the X-axis direction of the head group 114G is 1/N the length of the nozzle pitch in the X-axis direction of the heads 114, where N is the number of heads 114 included in the head group 114G. Hence, the nozzle linear density in the X-axis direction of each piece of the ejecting apparatus 300R, 300G, and 300B is higher than the nozzle linear density in the X-axis direction of a normal ink jet apparatus. The manufacturing system 3 is thus able to apply a fluorescent material to ejected portions of various sizes by simply changing the ejection data. Further, the manufacturing system 3 is able to manufacture a plasma display apparatus with various pitches by simply changing the ejection data.

Fifth Embodiment

An example when the invention is applied to a manufacturing system of an image display apparatus equipped with electron emitting elements will now be described.

A base body 70A shown in FIG. 24(*a*) and FIG. 24(*b*) is a substrate that will be made into an electron source substrate 70B in an image display apparatus through treatments applied in a manufacturing system 3 (FIG. 25) described below. The base body 70A includes a plurality of ejected portions 78 placed in a matrix fashion.

To be more specific, the base body 70A includes: a base body 72; a sodium diffusion preventing layer 74 position on the base body 72; a plurality of element electrodes 76A and 76B positioned on the sodium diffusion preventing layer 74; a plurality of metal wires 79A positioned on the plurality of element electrodes 76A; and a plurality of metal wires 79B positioned on the plurality of element electrodes 76B. Each of the plurality of metal wires 79A is a shape that extends in the Y-axis direction. Meanwhile, each of the plurality of metal wires 79B is a shape that extends in the X-axis direction. Because an insulation film 75 is formed in a space between the metal wires 79A and the metal wires 79B, the metal wires 79A and the metal wires 79B are electrically isolated from each other.

A portion including a pair of the element electrode 76A and the element electrode 76B corresponds to one pixel region. The element electrode 76A and the element electrode 76B forming a pair are spaced apart by a predetermined distance and oppose each other on the sodium diffusion preventing layer 74. The element electrode 76A corresponding to a given pixel region is electrically connected to the corresponding metal wire 79A. The element electrode 76B corresponding to that particular pixel region is electrically connected to the corresponding metal wire 79B. In this specification, a portion including the base body 72 and the sodium diffusion preventing layer 74 is occasionally referred to as the supporting substrate.

In each of the pixel regions on the base body 70A, part of the element electrode 76A, part of the element electrode 76B, and the sodium diffusion preventing layer 74 exposed through a space between the element electrode 76A and the element electrode 76B correspond to the ejected portion 78. To be more specific, the ejected portion 78 is a region where a conductive thin film 411F (FIG. 27) should be formed, and the conductive thin film 411F is formed to cover part of the element electrode 76A, part of the element electrode 76B, and a gap between the element electrodes 76A and 76B. As is indicated by a broken line in FIG. 24(*b*), the plane shape of the ejected portion 78 in this embodiment is circular. In this manner, the planar shape of the ejected potions of the invention can be a circular shape determined by the X-coordinate range and the Y-coordinate range.

The base body 70A shown in FIG. 24 (*b*) is positioned on a virtual plane parallel to both the X-axis direction and the Y-axis direction. The row direction and the column direction of a matrix comprising a plurality of ejected portions 78 are parallel to the X-axis direction and the Y-axis direction, respectively. In short, in the base body 70A, a plurality of ejected portions 78 are aligned in the X-axis direction and the Y-axis direction. The X-axis direction and the Y-axis direction intersect with each other at a right angle.

An interval LRY along the Y-axis direction, that is, a pitch, among the ejected portions 78 is about 190 μm. The length of the ejected portion 78R in the X-axis direction (the length of the X-coordinate range) is about 100 μm and the length in the Y-axis direction (the length of the Y-coordinate range) is also about 100 μm. The intervals among the ejected portions 78 and the size of the ejected portions correspond to the intervals and the size of the pixel regions in about a 40-inch high-definition TV.

Figure 25:
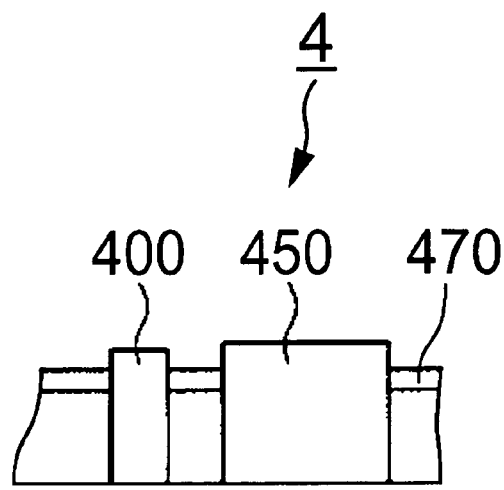
FIG. 25 is a schematic view showing a manufacturing system of the fifth embodiment.

The manufacturing system 4 shown in FIG. 25 is a system that ejects a conductive thin-film material 411 to the respective ejected portions 78 on the base body 70A of FIG. 24. To be more specific, the manufacturing system 4 includes an ejecting apparatus 400 to apply the conductive thin-film material 411 to all the ejected portions 78, and a drying apparatus 450 to dry the conductive thin-film material 411 on the ejected portions 78. Further, the manufacturing system 4 includes a transportation apparatus 470 to transport the base body 70A in order of the ejecting apparatus 400 and the drying apparatus 450.

Figure 26:
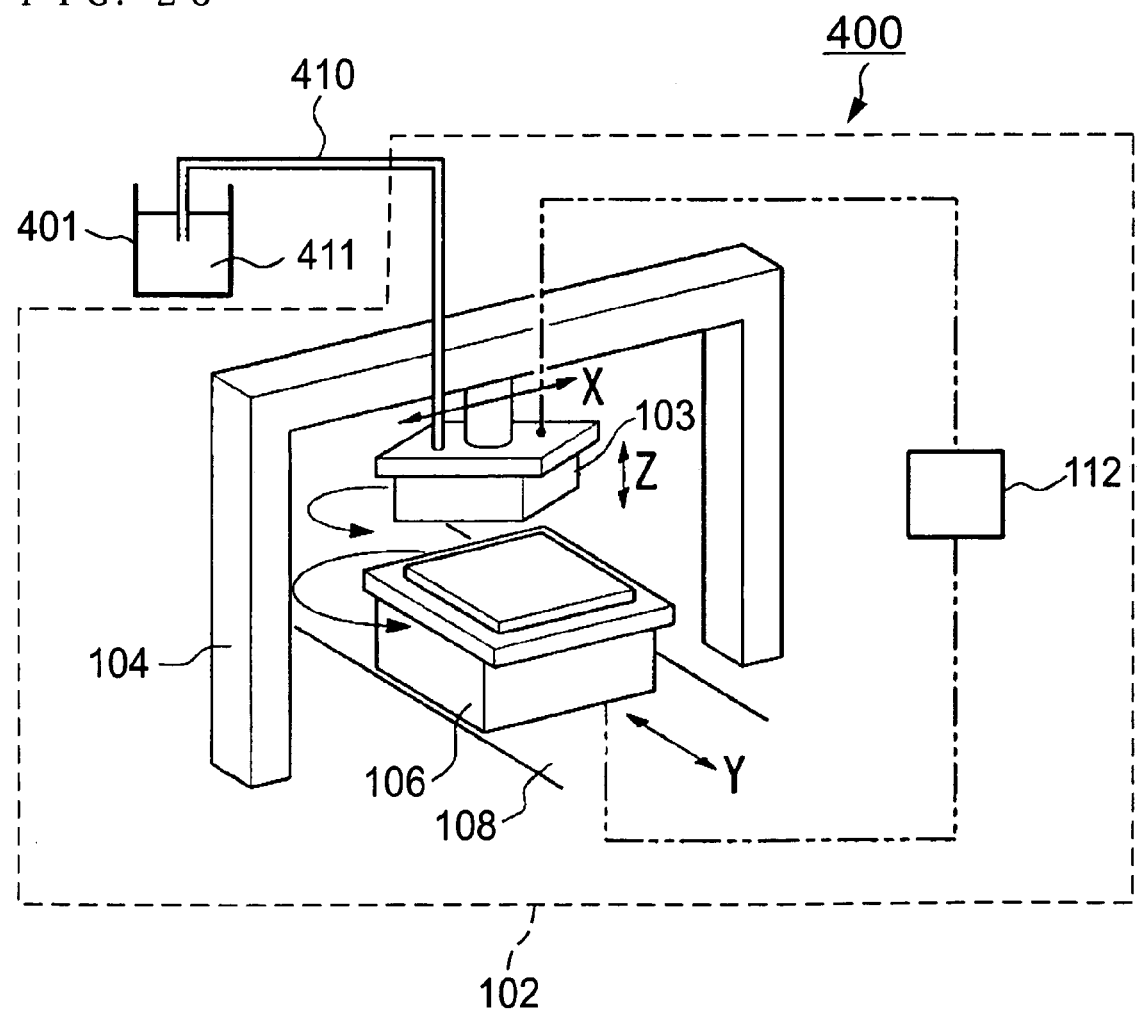
FIG. 26 is a schematic view showing an ejecting apparatus of the fifth embodiment.

The ejecting apparatus 400 shown in FIG. 26 includes a tank 401 to hold the liquid conductive thin-film material 411, a tube 410, and an ejection scanning portion 102 to which the conductive thin-film material 411 is supplied from the tank 401R via the tube 410. Because the ejection scanning portion 102 has been described in the first embodiment, a description is omitted. In this embodiment, the liquid conductive thin-film material 411 is an organic palladium solution. The liquid conductive thin-film material 411 in this embodiment is one example of a liquid material available in the invention.

A manufacturing method of an image display apparatus using the manufacturing system 4 will now be described. The sodium diffusion preventing layer 74, chiefly composed of $SiO_2$, is formed first on the base body 72 made of soda glass or the like. To be more specific, the sodium diffusion preventing layer 74 is obtained by depositing a $SiO_2$ film having a thickness of 1 μm on the base body 72 by means of sputtering. A titanium layer having a thickness of 5 nm is then deposited on the sodium diffusion preventing layer 74 by means of sputtering or vacuum evaporation. A plurality of pairs of the element electrodes 76A and the element electrodes 76B, which are spaced apart from each other by a predetermined distance in each pair, are made out of the titanium layer using the photolithography technique and the etching technique.

Subsequently, a plurality of metal wires 79A that extend in the Y-axis direction are formed on the sodium diffusion preventing layer 74 and the plurality of element electrodes 76A, by sintering Ag paste applied with the use of the screen printing technique. The insulation film 75 is then formed by sintering glass paste applied on part of each metal wire 79A with the use of the screen printing technique. A plurality of metal wires 79B that extend in the X-axis direction are then formed on the sodium diffusion preventing layer 74 and the plurality of element electrodes 76B, by sintering Ag paste applied with the use of the screen printing technique. When the metal wires 79B are formed, Ag paste is applied in such a manner that the metal wires 79B intersect with the metal wires 79A via the insulation film 75. The base body 70A as shown in FIG. 24 is obtained by the steps as described above.

Subsequently, the base body 70A is made lyophilic through the oxygen plasma treatment under ambient pressure. Through this treatment, part of the surfaces of the element electrodes 76A, part of the surfaces of the element electrodes 76B, and the surface of the supporting substrate exposed through spaces between the element electrodes 76A and the element electrodes 76B are turned to be lyophilic. Further, these surfaces are made into the ejected portions 78. A surface having desired lyophilic properties may be obtained without performing the surface treatment as described above depending on the quality of materials. In such a case, part of the surfaces of the element electrodes 76A, part of the surfaces of the element electrodes 76B, and the surface of the sodium diffusion preventing layer 74 exposed through spaces between the element electrodes 76A and the element electrodes 76B are obtained as the ejected portions 78 without applying the surface treatment.

Figure 27:
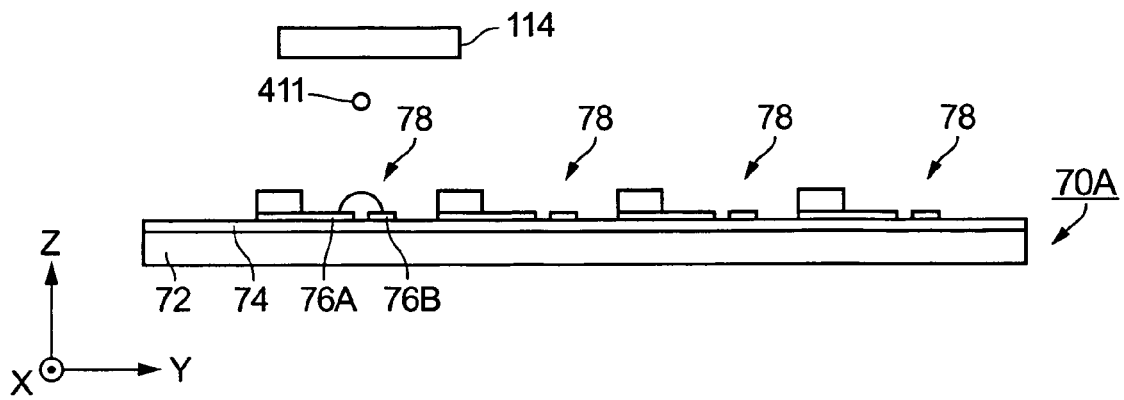
FIG. 27 is a schematic view showing a manufacturing method of the fifth embodiment.

The base body 70A, on which the ejected portions 78 are formed, is transported to the stage 106 of the ejecting apparatus 400 by the transportation apparatus 470, and placed on the stage 106. Then, as shown in FIG. 27, the ejecting apparatus 400 ejects the conductive thin-film material 411 from the heads 114 so that a conductive thin-film 411F is formed on all the ejected portions 78. To be particular, the ejecting apparatus 400 applies the conductive thin-film material 411 to the ejected portions 78 by the ejecting method described with reference to FIG. 12. In this embodiment, the control portion 112 provides the heads 114 with signals, so that the diameter of a droplet of the conductive thin-film material 411 landed on the ejected portion 78 is in a range from 60 μm to 80 μm. When the layer of the conductive thin-film material 411 is formed on all the ejected portions 78 on the base body 70A, the transportation apparatus 470 positions the base body 70A inside the drying apparatus 450. The conductive thin film 411F, chiefly composed of palladium oxides, is obtained on the ejected portions 78 by completely drying the conductive thin-film material 411 on the ejected portions 78. In this manner, in each of the pixel regions, the conductive thin film 411F is formed to cover part of the element electrodes 76A, part of the element electrodes 76B, and the sodium diffusion preventing layer 74 exposed through spaces between the element electrodes 76A and the element electrodes 76B.

An electron emitting portion 411D is then formed in part of the conductive thin film 411F by applying a pulsed, predetermined voltage across the element electrode 76A and the element electrode 76B. It is preferable to apply a voltage across the element electrode 76A and the element electrode 76B under an organic atmosphere and vacuum conditions, because electron emission efficiency from the electron emitting portion 411D is increased in this case. The element electrode 76A, the corresponding element electrode 76B, and the conductive thin film 411F provided with the electron emitting portion 411D together form an electron emitting element. Each electron emitting element corresponds to a pixel region.

Figure 28:
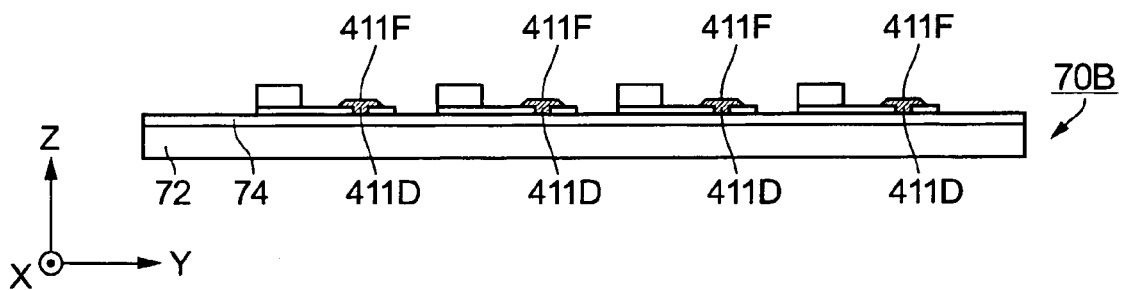
FIG. 28 is a schematic view showing the manufacturing method of the fifth embodiment.

The base body 70A is made into an electron source substrate 70B shown in FIG. 28 by the steps described above.

Figure 29:
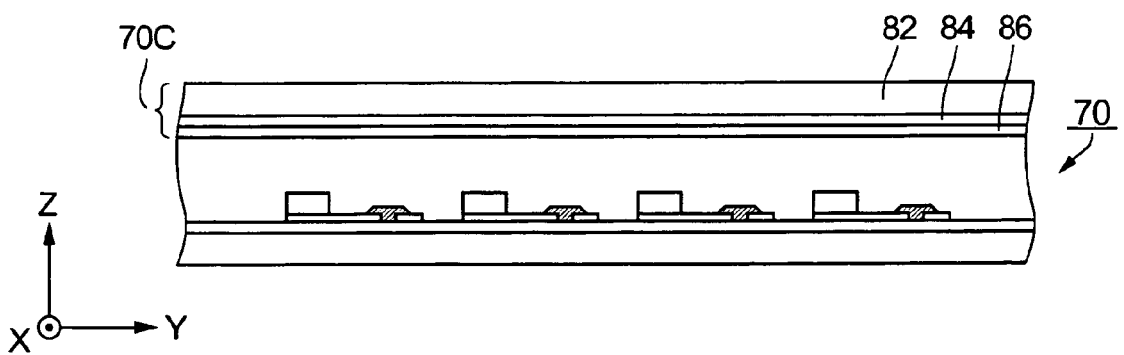
FIG. 29 is a schematic view showing the manufacturing method of the fifth embodiment.

Then, as shown in FIG. 29, an image display apparatus 70 is obtained by laminating the electron source substrate 70B and a front substrate 70C by a known method. The front substrate 70C includes a glass substrate 82, a plurality of fluorescent portions 84 positioned in a matrix fashion on the glass substrate 82, and a metal plate 86 covering the plurality of fluorescent portions 84. The metal plate 86 functions as an electrode to accelerate electron beams from the electron emitting portions 411D. The electron source substrate 70B and the front substrate 70C are positioned in such a manner that the plurality of electron emitting elements respectively oppose the plurality of fluorescent portions 84. Also, a space between the electron source substrate 70B and the front substrate 70C is maintained in a vacuum state.

The image display apparatus 70 equipped with the electron emitting elements as described above is also referred to as an SED (Surface-Conduction Electron-Emitter Display) or an FED (Field Emission Display). In this specification, a liquid crystal display apparatus, an electroluminescent display apparatus, a plasma display apparatus, an image display apparatus using electron emitting elements, etc. are occasionally referred to as "an electro-optic apparatus". The "electro-optic apparatus" referred to in this specification is not limited to an apparatus that uses changes of optical characteristics (so-called electro-optic effect), such as a change in birefringence, a change in optical rotation, and a change in light scattering, and it means a general apparatus that emits, transmits, or reflects light in response to application of a signal voltage.

According to this embodiment, in the ejecting apparatus 400, the nozzle pitch in the X-axis direction of the head group 114G is 1/N the length of the nozzle pitch in the X-axis direction of the heads 114, where N is the number of heads 114 included in the head group 114G. Hence, the nozzle linear density in the X-axis direction of the ejecting apparatus 400 is higher than the nozzle linear density in the X-axis direction of a normal ink jet apparatus. The manufacturing system 4 is thus able to apply a conductive thin-film material to ejected portions of various sizes by simply changing the ejection data. Further, the manufacturing system 4 is able to manufacture an electron source substrate with various pitches by simply changing the ejection data.

What is claimed is:

1. An ejecting apparatus, comprising:
   a stage;
   a plurality of heads movable in a Y-axis direction relatively with respect to said stage, said plurality of heads being adjacent to each other in said Y-axis direction; and
   a head driving portion, wherein:
   each of said plurality of heads includes a first nozzle array and a second nozzle array both extending in an X-axis direction;
   in each of said plurality of heads, DA equals a distance between said first nozzle array and said second nozzle array;
   a distance between said second nozzle array in one arbitrary head of said plurality of heads and said first nozzle array in another head adjacent to said arbitrary head is substantially equal to an integer multiple of DA;

said X-axis direction and said Y-axis direction intersect with each other at a right angle;

said head driving portion generates a driving signal including a plurality of ejection waveforms that are repeated in predetermined ejection periods and supplies an ejection signal with each of said plurality of heads based on said driving signal;

said driving signal is common to all the nozzle arrays of said plurality of heads;

said plurality of heads are arranged in a first head group and a second head group, the heads in the first head group at least partially overlapping each other in the Y-axis direction, the heads in the second head group at least partially overlapping each other in the Y-axis direction, the heads in the first head group each in a non-overlapping position with respect to the heads in the second head group in the X-axis direction;

a plurality of nozzles are placed in said first nozzle array and said second nozzle array such that a first nozzle pitch between the nozzles of the first and second nozzle arrays of the same head in said X-axis direction has a specific value for each of said plurality of heads;

said first head group includes heads;

a second nozzle pitch between the nozzles of said first nozzle array of said arbitrary head of said heads and said first nozzle array of said other head adjacent to said arbitrary head in said X-axis direction is substantially equal to 1/N of said specific value; and a distance between a last nozzle of said first nozzle array of a first head of said first head group and a first nozzle of said first nozzle array of a first head of said second head group is substantially equal to a third nozzle pitch between the nozzles of said first nozzle array of said arbitrary head of said N heads in said X-axis direction.

2. The ejecting apparatus according to claim 1, wherein:
said stage holds a base body having a target portion; and
said plurality of heads move in said Y-axis direction relatively with respect to said stage such that said first nozzle array and said second nozzle array in any one of said plurality of heads enter a region corresponding to said target portion and eject a liquid material from corresponding nozzles at a time interval substantially equal to an integer multiple of an ejection period.

3. The ejecting apparatus according to claim 1, wherein:
said stage holds a base body having a plurality of target portions aligned at predetermined pitches in said Y-axis direction; and
said plurality of heads move in said Y-axis direction relatively with respect to said stage such that one of said first nozzle array and said second nozzle array in any one of said plurality of heads enters regions respectively corresponding to said plurality of target portions and eject a liquid material from corresponding nozzles at time intervals substantially equal to integer multiples of an ejection period.

4. The ejecting apparatus according to claim 3, wherein:
a plane image of each of said plurality of target portions is a rectangular shape determined by long sides and short sides; and
said stage holds said base body such that a direction of said long sides is parallel to said X-axis direction and a direction of said short sides is parallel to said Y-axis direction.

5. The ejecting apparatus according to claim 1, wherein:
a fourth nozzle pitch between said first nozzle of said first nozzle array of said arbitrary head in said first head group and all other first nozzles of said first nozzle array of the other heads in said first head group is substantially equal to j/N of said specific value, where j is a natural number from 1 to (N−1).

* * * * *

UNITED STATES PATENT AND TRADEMARK OFFICE
CERTIFICATE OF CORRECTION

PATENT NO. : 7,748,824 B2  Page 1 of 1
APPLICATION NO. : 10/965005
DATED : July 6, 2010
INVENTOR(S) : Masayuki Tashiro and Mitsuru Kuribayashi It is certified that error appears in the above-identified patent and that said Letters Patent is hereby corrected as shown below:

Title Page, (75) Inventors:   "Masasyuki" should be -- Masayuki --

Signed and Sealed this

Seventh Day of September, 2010

David J. Kappos
*Director of the United States Patent and Trademark Office*